US012610466B2

(12) United States Patent
Lu

(10) Patent No.: US 12,610,466 B2
(45) Date of Patent: Apr. 21, 2026

(54) CIRCUIT STRUCTURE

(71) Applicant: Advanced Semiconductor Engineering, Inc., Kaohsiung (TW)

(72) Inventor: Wen-Long Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 308 days.

(21) Appl. No.: 18/119,268

(22) Filed: Mar. 8, 2023

(65) Prior Publication Data

US 2024/0306295 A1 Sep. 12, 2024

(51) Int. Cl.
| | |
|---|---|
| *H05K 1/11* | (2006.01) |
| *H01L 21/768* | (2006.01) |
| *H05K 1/02* | (2006.01) |
| *H05K 3/40* | (2006.01) |

(52) U.S. Cl.
CPC ........ *H05K 1/115* (2013.01); *H01L 21/76871* (2013.01); *H05K 1/024* (2013.01); *H05K 3/40* (2013.01); *H05K 2201/09145* (2013.01); *H05K 2201/09218* (2013.01); *H05K 2201/095* (2013.01); *H05K 2203/0502* (2013.01)

(58) Field of Classification Search
CPC ........... H05K 1/115; H05K 1/024; H05K 3/40
See application file for complete search history.

(56) References Cited

U.S. PATENT DOCUMENTS

2007/0033457 A1 2/2007 Park et al.
2022/0199509 A1* 6/2022 Huang ................ H01L 21/4857

* cited by examiner

*Primary Examiner* — Jeremy C Norris
(74) *Attorney, Agent, or Firm* — Foley & Lardner LLP

(57) ABSTRACT

A circuit structure includes a low-density conductive structure, a high-density conductive structure and a plurality of traces. The high-density conductive structure is disposed over the low-density conductive structure, and defines an opening extending from a top surface of the high-density conductive structure to a bottom surface of the high-density conductive structure. The opening exposes a first pad of the low-density conductive structure and a second pad of the low-density conductive structure. The second pad is spaced apart from the first pad. The traces extend from the top surface of the high-density conductive structure into the opening. The traces include a first trace connecting to the first pad of the low-density conductive structure and a second trace connecting to the second pad of the low-density conductive structure.

20 Claims, 46 Drawing Sheets

CIRCUIT STRUCTURE

BACKGROUND

1. Field of the Disclosure

The present disclosure relates to a circuit structure and a manufacturing method, and to a circuit structure including at least one opening, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a circuit structure includes a low-density conductive structure, a high-density conductive structure and a plurality of traces. The high-density conductive structure is disposed over the low-density conductive structure, and defines an opening extending from a top surface of the high-density conductive structure to a bottom surface of the high-density conductive structure. The opening exposes a first pad of the low-density conductive structure and a second pad of the low-density conductive structure. The second pad is spaced apart from the first pad. The traces extend from the top surface of the high-density conductive structure into the opening. The traces include a first trace connecting to the first pad of the low-density conductive structure and a second trace connecting to the second pad of the low-density conductive structure.

In some embodiments, a circuit structure includes a low-density conductive structure, a high-density conductive structure and a plurality of electrical traces. The high-density conductive structure is disposed over the low-density conductive structure, and defines an opening extending through the high-density conductive structure. The electrical traces are spaced apart from each other and disposed in the opening. The electrical traces are configured to electrically connect the high-density conductive structure and the low-density conductive structure. A length of the opening is greater than a depth of the opening.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
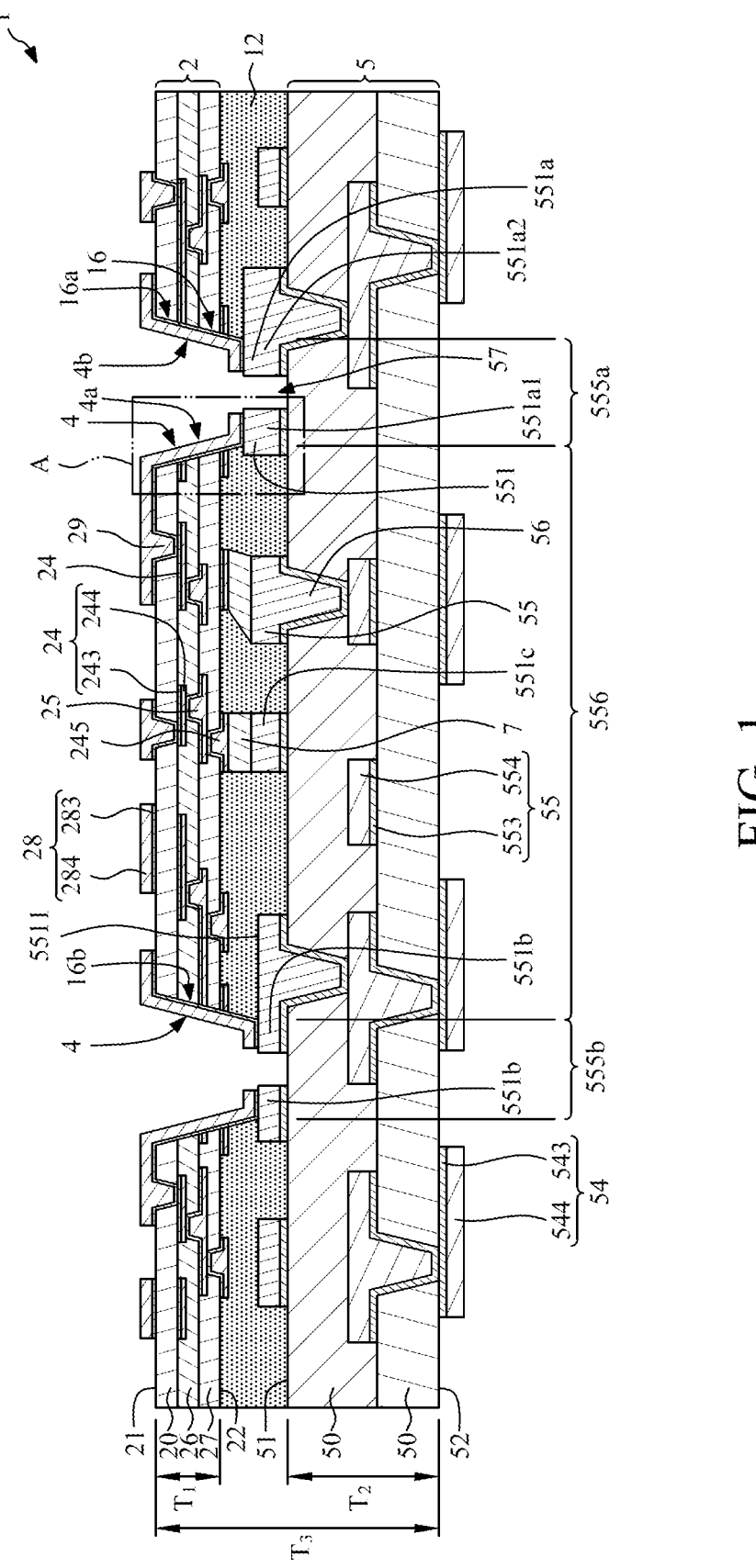
FIG. 1 illustrates a cross-sectional view of a circuit structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
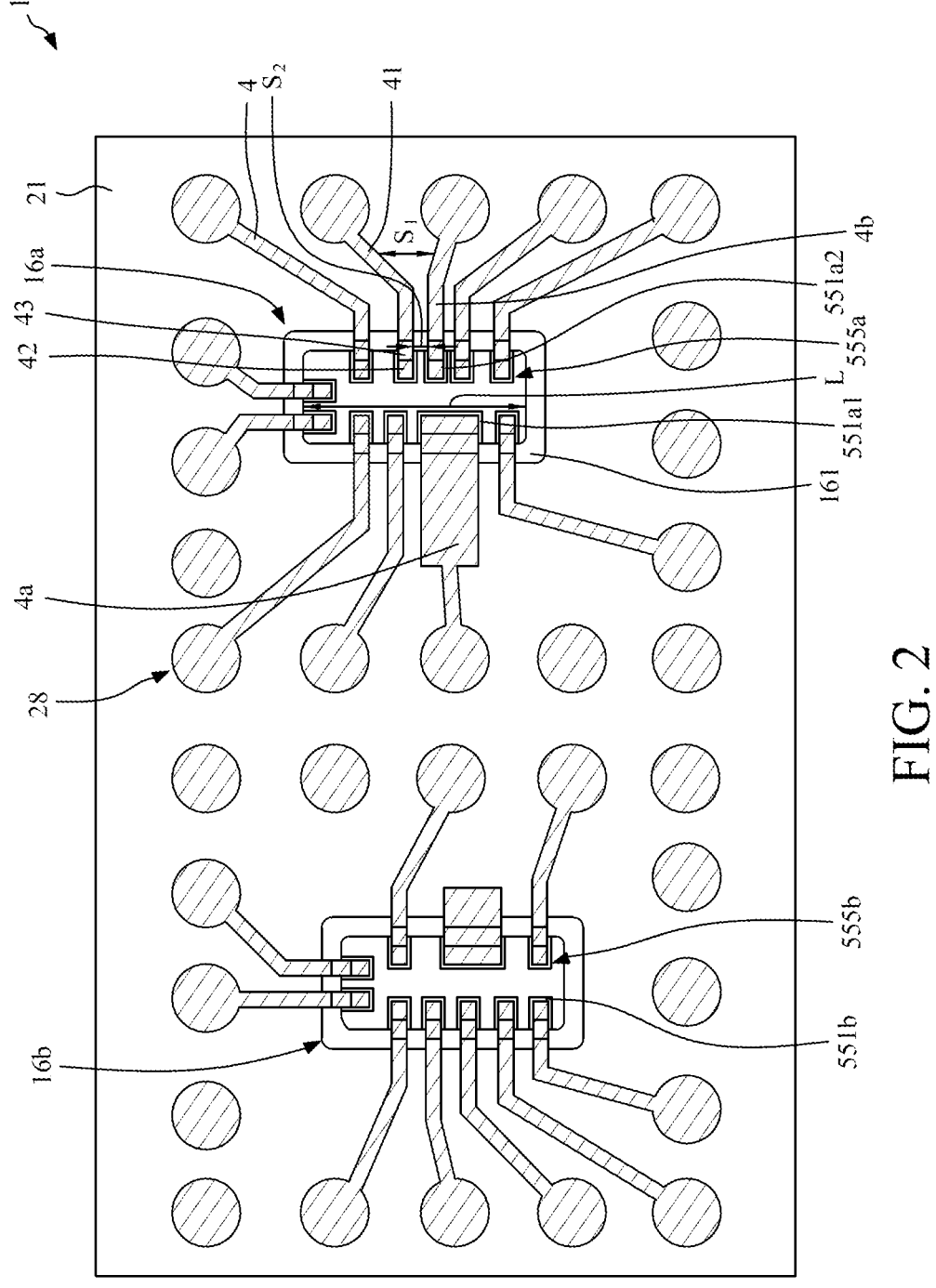
FIG. 2 illustrates a top view of the circuit structure in FIG. 1.
Figure 3:
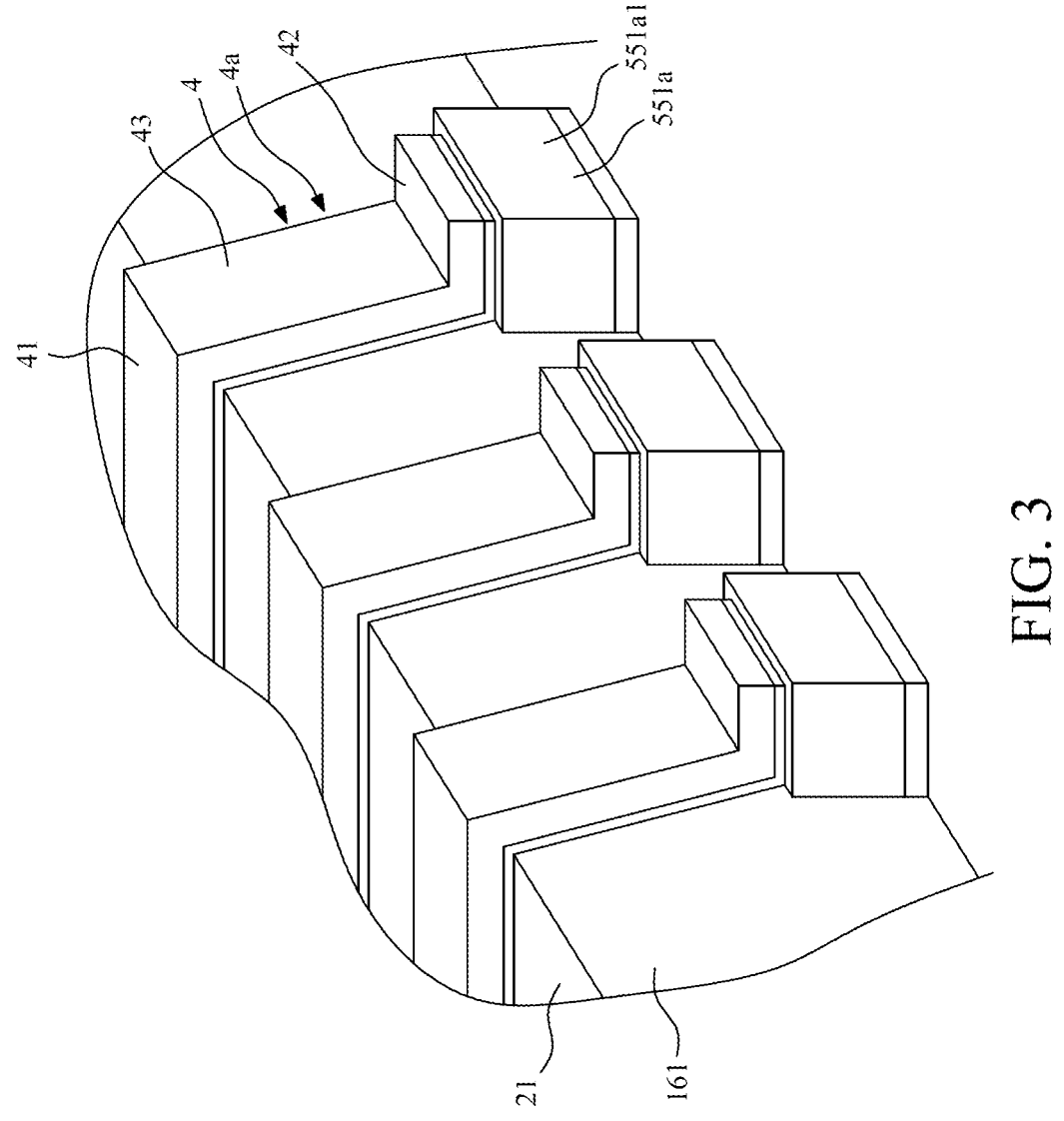
FIG. 3 illustrates a partially enlarged perspective view of an opening in FIG. 1.
Figure 3A:
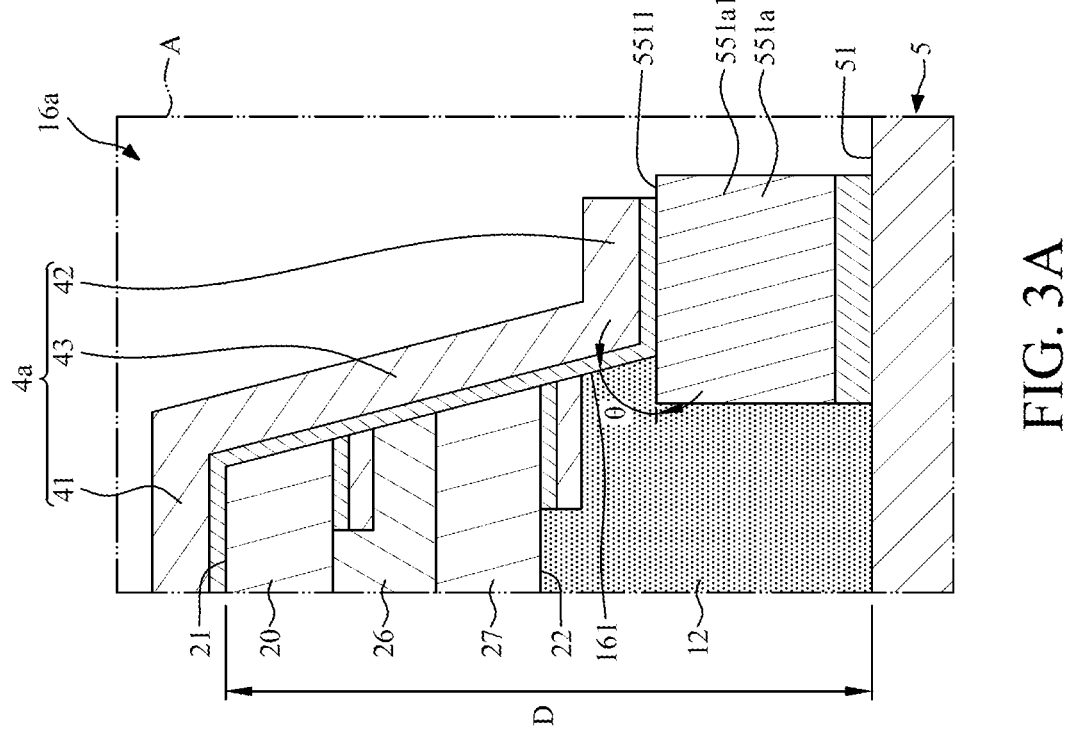
FIG. 3A illustrates a partially enlarged view of a region "A" in FIG. 1.

FIG. 1 illustrates a cross-sectional view of a circuit structure 1 according to some embodiments of the present disclosure. FIG. 2 illustrates a top view of the circuit structure 1 in FIG. 1. FIG. 3 illustrates a partially enlarged perspective view of an opening 16*a* in FIG. 1. FIG. 3A illustrates a partially enlarged view of a region "A" in FIG. 1. The circuit structure 1 may include a high-density conductive structure 2, a low-density conductive structure 5, at least one interconnector 7 and an adhesion layer 12. The circuit structure 1 may be also referred to as "an electronic structure" or "a wiring structure".

The high-density conductive structure 2 may be disposed over the low-density conductive structure 5, and may include at least one dielectric layer (including, for example, a first dielectric layer 20, a second dielectric layer 26 and a third dielectric layer 27), at least one inner circuit layer 24 (formed of a metal, a metal alloy, or other conductive material) in contact with the dielectric layers 26, 27, a plurality of inner conductive vias 25, an outer circuit layer 28 (formed of a metal, a metal alloy, or other conductive material) in contact with the dielectric layer 20 and a plurality of outer conductive vias 29. In some embodiments, the high-density conductive structure 2 may be similar to a coreless substrate, and may be a bumping level redistribution structure. The high-density conductive structure 2 may be also referred to as "a high-density stacked structure", or "a first conductive traces structure". The inner circuit layers 24 and the outer circuit layer 28 of the high-density conductive structure 2 may be also referred to as "high-density circuit layers" or "conductive patterned layers". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The high-density conductive structure 2 has a top surface 21 and a bottom surface 22 opposite to the top surface 21. As shown in FIG. 1, the dielectric layers 20, 26, 27 are stacked on one another. For example, the first dielectric layer 20 may be the topmost dielectric layer. In some embodiments, a material of the dielectric layers 20, 26, 27 is transparent, and can be seen through or detected by human eyes or machine. In some embodiments, a transparent material of the dielectric layers 20, 26, 27 has a light transmission for a wavelength in the visible range (or other pertinent wavelength for detection of a mark) of at least about 60%, at least about 70%, or at least about 80%. In some embodiments, a material of the dielectric layers 20, 26, 27 may be made of a cured photoimageable dielectric (PID) material such as epoxy or polyimide (PI) including photoinitiators.

The inner circuit layers 24 and the outer circuit layer 28 may be a fan-out circuit layer or a redistribution layer (RDL), and an L/S of the inner circuit layers 24 and the outer circuit layer 28 may be less than about 10 μm/10 μm, less than or equal to 8 μm/8 μm, less than or equal to 5 μm/5 μm, less than or equal to 3 μm/3 μm, less than or equal to about 2 μm/about 2 μm, or less than or equal to about 1.8 μm/about 1.8 μm. In some embodiments, the inner circuit layers 24 is embedded in the corresponding dielectric layers 26, 27. In some embodiments, the inner circuit layer 24 may include a seed layer 243 and a conductive material 244 (e.g., a plating metallic material) disposed on the seed layer 243. As shown in FIG. 1, the bottommost inner circuit layer 24 is disposed on the third dielectric layer 27. The inner conductive vias 25 may be also referred to as "inner vias 25." Some of the inner conductive vias 25 are disposed between two adjacent inner circuit layers 24 for electrically connecting the two inner circuit layers 24. In some embodiments, each inner conductive via 25 may include the seed layer 243 and the conductive material 244 disposed on the seed layer 243. Each inner conductive via 25 tapers upwardly along a direction from the bottom surface 22 towards the top surface 21 of the high-density conductive structure 2. The bottommost inner circuit layer 24 may include a plurality of bottommost pads 245 protruding from the bottom surface 22 of the high-density conductive structure 2.

The outer circuit layer 28 is disposed on the first dielectric layer 20. In some embodiments, the outer circuit layer 28 may include a seed layer 283 and a conductive material 284 (e.g., a plating metallic material) disposed on the seed layer 283. The outer circuit layer 28 may include a plurality of traces 4. The traces 4 may be also referred to as "electrical traces 4." The traces 4 may include a first trace 4a and a second trace 4b spaced apart from each other. Some of the outer conductive vias 29 are disposed between the outer circuit layer 28 and the inner circuit layers 24 for electrically connecting the outer circuit layer 28 and the inner circuit layers 24. In some embodiments, each outer conductive via 29 may include the seed layer 283 and the conductive material 284 disposed on the seed layer 283. Each outer conductive via 29 tapers downwardly along a direction from the top surface 21 towards the bottom surface 22 of the high-density conductive structure 2. Thus, a tapering direction of the outer conductive via 29 is different from a tapering direction of the inner conductive via 25.

The high-density conductive structure 2 may define an opening 16 (or an accommodating hole) extending through the high-density conductive structure 2 to expose a plurality of pads 551 of the low-density conductive structure 5. The traces 4 of the outer circuit layer 28 may be disposed in the opening 16 and electrically connected to the exposed pads 551 of the low-density conductive structure 5.

The low-density conductive structure 5 includes at least one dielectric layer (including, for example, two dielectric layers 50), at least one circuit layer (including, for example, two upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). In some embodiments, the low-density conductive structure 5 may be a coreless substrate. The low-density conductive structure 5 may be also referred to as "a substrate structure", "a lower stacked structure", "a lower conductive structure", "a low-density stacked structure", or "a second conductive traces structure". The circuit layers 55, 54 of the low-density conductive structure 5 may be also referred to as "a low-density circuit layer". As shown in FIG. 1, the low-density conductive structure 5 has a top surface 51 and a bottom surface 52 opposite to the top surface 51.

The upper circuit layers 55 may include a seed layer 553 and a conductive material 554 (e.g., a plating metallic material) disposed on the seed layer 553. The inner conductive via 56 may also include the seed layer 553 and the conductive material 554. The lower circuit layer 54 is disposed on the bottom surface 52 of the low-density conductive structure 5. The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the low-density conductive structure 5. Thus, a tapering direction of the inner conductive via 56 of the low-density conductive structure 5 is different from the tapering direction of the inner conductive via 25 of the high-density conductive structure 2.

A thickness of each of the dielectric layers 20, 26, 27 of the high-density conductive structure 2 is less than or equal to about 40%, less than or equal to about 35%, or less than or equal to about 30% of a thickness of each of the dielectric layers 50 of the low-density conductive structure 5. In addition, a material of the dielectric layers 50 of the low-density conductive structure 5 may be different from the material of the dielectric layers 20, 26, 27 of the high-density conductive structure 2. For example, the material of the dielectric layers 50 of the low-density conductive structure 5 may be polypropylene (PP) or ajinomoto build-up film (ABF).

An L/S of the upper circuit layer 55 and the lower circuit layer 54 of the low-density conductive structure 5 may be greater than or equal to about 10 μm/about 10 μm. Thus, the L/S of the upper circuit layer 55 and the lower circuit layer 54 may be greater than or equal to about three times, or five times the L/S of the circuit layers 24, 28 of the high-density conductive structure 2.

In some embodiments, the topmost upper circuit layer 55 may include a plurality of topmost pads 551 (including at least one first pad 551a, at least one second pad 551b and at least one third pad 551c) protruding from the top surface 51 of the low-density conductive structure 5. In some embodiments, the at least one first pad 551a may include two pads 551*a*1, 551*a*2. The pad 551*a*1 may be also referred to as "a first pad 551*a*1", and the pad 551*a*2 may be also referred to as "a second pad 551*a*2." The second pad 551*a*2 may be spaced apart from the first pad 551*al*. The second pad 551*a*2 and the first pad 551*al* are disposed on a topmost dielectric layer 50 of the low-density conductive structure 5. The opening 16 of the high-density conductive structure 2 may include a first opening 16*a* and a second opening 16*b*. The first pad(s) 551*a* (including the pads 551*a*1, 551*a*2) may correspond to or may be exposed in the first opening 16*a* of the high-density conductive structure 2. The second pad(s) 551*b* may correspond to or may be exposed in the second opening 16*b* of the high-density conductive structure 2. The third pad(s) 551*c* may be disposed between or disposed around the first pad(s) 551*a* and the second pad(s) 551*b*. A thickness of the first pad 551*a*, a thickness of the second pad 551*b* and a thickness of the third pad 551*c* may be different from each other. For example, the thickness of the first pad 551*a* may be greater than the thickness of the third pad 551*c*, and the thickness of the third pad 551*c* may be greater than the thickness of the second pad 551*b*. Thus, the top surfaces 5511 of the topmost pads 551 (including the first pad 551*a*, the second pad 551*b* and the third pad 551*c*) have different elevations. In some embodiments, the interconnector 7 (e.g., solder material) may physically connect and electrically connect at least one of the bottommost pads 245 of the bottommost inner circuit layer 24 of the high-density conductive structure 2 and at least one of the topmost pads 551 (e.g., the third pad 551*c*) of the topmost upper circuit layer 55 of the low-density conductive structure 5. Thus, the high-density conductive structure 2 may be electrically connected to the low-density conductive structure 5 through the interconnector 7. The interconnector 7 may be disposed around the openings 16 (e.g., the first opening 16*a* and the second opening 16*b*) of the high-density conductive structure 2.

The adhesion layer 12 is interposed or disposed between the high-density conductive structure 2 and the low-density conductive structure 5, and is configured to bond the high-density conductive structure 2 and the low-density conductive structure 5 together. That is, the adhesion layer 12 adheres to the bottom surface 22 of the high-density conductive structure 2 and the top surface 51 of the low-density conductive structure 5. In some embodiments, the adhesion layer 12 may be cured from an adhesive material (e.g., includes a cured adhesive material such as an adhesive polymeric material). Thus, the adhesion layer 12 contacts the bottommost dielectric layer (i.e., the third dielectric layer 27) of the high-density conductive structure 2 and the topmost dielectric layer 55 of the low-density conductive structure 5. In some embodiments, the interconnector 7, the bottommost pads 245 of the bottommost inner circuit layer 24 of the high-density conductive structure 2 and the topmost pads 551 of the topmost upper circuit layer 55 of the low-density conductive structure 5 may be embedded in the adhesion layer 12.

In some embodiments, a material of the adhesion layer 12 is transparent, and can be seen through by human eyes or machine. That is, a mark disposed adjacent to the top surface 51 of the low-density conductive structure 5 can be recognized or detected from the top surface 21 of the high-density conductive structure 2 by human eyes or machine. In addition, the material of adhesion layer 12 may be different from the material of the dielectric layers 50 the low-density conductive structure 5 and the material of the dielectric layers 20, 26, 27 of the high-density conductive structure 2.

For example, the material of the adhesion layer 12 may be ABF, or ABF-like dielectric film.

The opening 16 (e.g., the first opening 16*a* and the second opening 16*b*) may extend through or penetrate through the adhesion layer 12. Thus, the high-density conductive structure 2 and the adhesion layer 12 may collectively define the opening 16 (e.g., the first opening 16*a* and the second opening 16*b*) for accommodating the traces 4 of the outer circuit layer 28 of the high-density conductive structure 2. Thus, the opening 16 (e.g., the first opening 16*a* and the second opening 16*b*) may be configured to accommodate a plurality of separated electrical paths (e.g., the traces 4) between the high-density conductive structure 2 and the low-density conductive structure 5. The traces 4 (e.g., the electrical traces 4) are spaced apart from each other and are disposed in the opening 16 (e.g., the first opening 16*a* and the second opening 16*b*). The traces 4 (e.g., the electrical traces 4) are configured to electrically connect the high-density conductive structure 2 and the low-density conductive structure 5. The opening 16 is not filled with a conductive material. In addition, the opening 16 (e.g., the first opening 16*a* and the second opening 16*b*) may expose a portion of a topmost dielectric layer 50 of the low-density conductive structure 5. In some embodiments, the opening 16 (e.g., the first opening 16*a*) may be in communication with a gap 57 between two of the plurality of topmost pads 551 (e.g., the first pad 551*a*). Alternatively, the gap 57 may be a portion of the opening 16 (e.g., the first opening 16*a*).

A length L (e.g., a maximum length L) of the opening 16 (e.g., the first opening 16*a*) may be greater than or equal to a depth D of the opening 16 (e.g., the first opening 16*a*). The length L of the opening 16 (e.g., the first opening 16*a*) may be greater than a thickness $T_1$ of the high-density conductive structure 2. The length L of the opening 16 (e.g., the first opening 16*a*) may be greater than a thickness $T_2$ of the low-density conductive structure 5. The length L of the opening 16 (e.g., the first opening 16*a*) may be greater than a thickness $T_3$ of the circuit structure 1.

A topmost circuit layer 55 of the low-density conductive structure 5 may include at least one high-density region (e.g., a first high-density region 555*a* and a second high-density region 555*b*) and a low-density region 556 outside or surrounding the high-density region (e.g., the first high-density region 555*a* and the second high-density region 555*b*). For example, the first high-density region 555*a* is exposed in the first opening 16*a*, and the second high-density region 555*b* is exposed in the second opening 16*b*.

The first pads 551*a* may be located in the first high-density region 555*a*, and the second pads 551*b* may be located in the second high-density region 555*b*. In some embodiments, a L/S of the first pads 551*a* in the first high-density region 555*a* of the low-density conductive structure 5 may be substantially equal to a L/S of the inner circuit layer 24 of the high-density conductive structure 2. Further, a L/S of the second pads 551*b* in the second high-density region 555*b* of the low-density conductive structure 5 may be substantially equal to a L/S of the inner circuit layer 24 of the high-density conductive structure 2. In some embodiments, the high-density region (e.g., the first high-density region 555*a* and the second high-density region 555*b*) of the low-density conductive structure 5 is electrically connected to the high-density conductive structure 2 through the electrical paths (e.g., the traces 4) in the opening 16 (e.g., the first opening 16*a* and the second opening 16*b*). The low-density region 556 of the low-density conductive structure 5 is electrically connected to the high-density conductive structure 2 through the interconnectors 7 around the opening 16 (e.g., the first opening 16a and the second opening 16b).

Referring to FIG. 3A, an inclination angle θ of the inner sidewall 161 of the opening 16 (e.g., the first opening 16a) may be 30 degrees to 88 degrees. For example, an inclination angle θ between the inner sidewall 161 of the first opening 16a and a top surface 5511 of the first pad 551a may be 30 degrees to 88 degrees.

Referring to FIG. 1 and FIG. 3, the traces 4 may be portions of a patterned layer and may include the seed layer 283 and the conductive material 284 disposed on the seed layer 283. The traces 4 are disposed on an inner sidewall 161 of the opening 16 (e.g., the first opening 16a and the second opening 16b). The traces 4 extend from the top surface 21 of the high-density conductive structure 2 to the topmost pads 551 (e.g., the first pads 551a and the second pads 551b) of the low-density conductive structure 5. For example, the trace 4 (e.g., the first trace 4a) may include a first portion 41, a second portion 42 and a middle portion 43 connecting the first portion 41 and the second portion 42. The trace 4 (e.g., the first trace 4a) may be a monolithic or one-piece structure. The first portion 41 of the trace 4 (e.g., the first trace 4a) may be disposed on and may contact the top surface 21 of the high-density conductive structure 2. The second portion 42 of the trace 4 (e.g., the first trace 4a) may be disposed on and may contact the topmost pads 551 (e.g., first pads 551a and the second pads 551b) of the low-density conductive structure 5. The middle portion 43 may be disposed on and may contact the inner sidewall 161 of the opening 16 (e.g., the first opening 16a and the second opening 16b). Thus, the trace 4 (e.g., the first trace 4a) may be a three-dimensional trace, and may include two turning points. The trace 4 (e.g., the first trace 4a) may cover a plurality of dielectric layers 20, 26, 27 of the high-density conductive structure 2. Thus, the high-density conductive structure 2 may be electrically connected to the low-density conductive structure 5 through the traces 4.

Referring to FIG. 2, the first trace 4a may have a first width, and the second trace 4b may have a second width. The first width of the first trace 4a may be different from the second width of the second trace 4b. For example, the first width of the first trace 4a may be greater than the second width of the second trace 4b. The first trace 4a may be configured to provide a ground pathway or a power pathway, and the second trace 4b may be configured to transmit signals. In addition, a spacing S1 between two first portions 41 of two adjacent traces 4 is greater than a spacing S2 between two middle portions 43 of the two traces 4. A pitch of the first pads 551a in the first high-density region 555a and a pitch of the second pads 551b in the second high-density region 555b of the low-density conductive structure 5 may be substantially equal to a pitch of the middle portions 43 and the second portions 42 of the traces 4.

As shown in FIG. 1 and FIG. 2, the opening 16 (e.g., the first opening 16a and the second opening 16b) extends from the top surface 21 of the high-density conductive structure 2 to the bottom surface 22 of the high-density conductive structure 2, and exposes the first pad 551al and the second pad 551a2 of the low-density conductive structure 5. The traces 4 (e.g., the first trace 4a and the second trace 4b) extend from the top surface 21 of the high-density conductive structure 2 into the opening 16 (e.g., the first opening 16a). The first trace 4a connects to the first pad 551al of the low-density conductive structure 5, and the second trace 4b connects to the second pad 551a2 of the low-density conductive structure 5. The opening 16 (e.g., the first opening 16a and the second opening 16b) tapers toward the low-density conductive structure 5. In some embodiments, the traces 4 (e.g., the first trace 4a and the second trace 4b) may be formed through a photolithography process. 161. In some embodiments, the first opening 16a may include a first portion 57 (i.e., the gap 57) between the first pad 551al and the second pad 551a2. In some embodiments, the first trace 4a may overlap the inner circuit layers 24 (e.g., the conductive patterned layers 24) in a direction parallel with the top surface 21 of the high-density conductive structure 2. That is, the first trace 4a may horizontally overlap the inner circuit layers 24 (e.g., the conductive patterned layers 24). In some embodiments, the inner circuit layers 24 (e.g., the conductive patterned layers 24) are electrically connected to each other through the inner conductive vias 25 (e.g., the inner vias 25). The first trace 4a is nonparallel with one of the inner conductive vias 25 (e.g., the inner vias 25). The inner conductive vias 25 (e.g., the inner vias 25) taper away from the low-density conductive structure 5. The inner conductive vias 25 (e.g., the inner vias 25) taper toward the top surface 21 of the high-density conductive structure 2. In some embodiments, the first trace 4a may be the conductive material 284, and the seed layer 283 may be between the first trace 4a (e.g., the conductive material 284) and the high-density conductive structure 2. In some embodiments, the second dielectric layer 26 may be stacked on the third dielectric layer 27, the first dielectric layer 20 may be stacked on the second dielectric layer 26. The opening 16 (e.g., the first opening 16a and the second opening 16b) may penetrate or extend through the first dielectric layer 20, the second dielectric layer 26 and the third dielectric layer 27 concurrently.

As shown in FIG. 1, FIG. 3 and FIG. 3A, the opening 16a may define the inner sidewall 161 of the high-density conductive structure 2. The first trace 4a and the second trace 4b may be arranged along the inner sidewall 161.

As shown in the embodiment illustrated in FIG. 1 to FIG. 3A, the circuit structure 1 is a combination of the high-density conductive structure 2 and the low-density conductive structure 5, in which the circuit layers 24, 28 of the high-density conductive structure 2 has fine pitch, high yield and low thickness; and the upper circuit layers 55 of the low-density conductive structure 5 have low manufacturing cost. Thus, the circuit structure 1 has an advantageous compromise of yield and manufacturing cost, and the circuit structure 1 has a relatively low thickness. In addition, the opening 16 (e.g., the first opening 16a and the second opening 16b) may accommodate a plurality of separated traces 4. Thus, the number of I/O connections of the circuit structure 1 may be increased without enlarging the size of the circuit structure 1.

In a comparative embodiment, a through hole extending through the high-density conductive structure 2 may be filled with a conductive material to form a conductive via to connect the pads 551 of the low-density conductive structure 5. Such through hole may have a relatively large length, and the bottom portion of the through hole may have a relatively small size (e.g., a small width) if the size (e.g., a width) of the top portion of the through hole is fixed. For example, a ratio of a depth of the through hole to a maximum width of the through hole may be greater than 3:1. During the electroplating of the conductive via, void may occur at the small-sized bottom portion of the through hole, which may adversely affect the quality of the electroplating and may reduce the yield rate of the conductive via. In a worst case, the through hole may not expose the pads 551 of the low-density conductive structure 5, and conductive via may not reach to and connect to the pads 551 of the low-density conductive structure 5. That is, the conductive material of the conductive via may not be plated on the pads 551 of the low-density conductive structure 5.

Figure 3B:
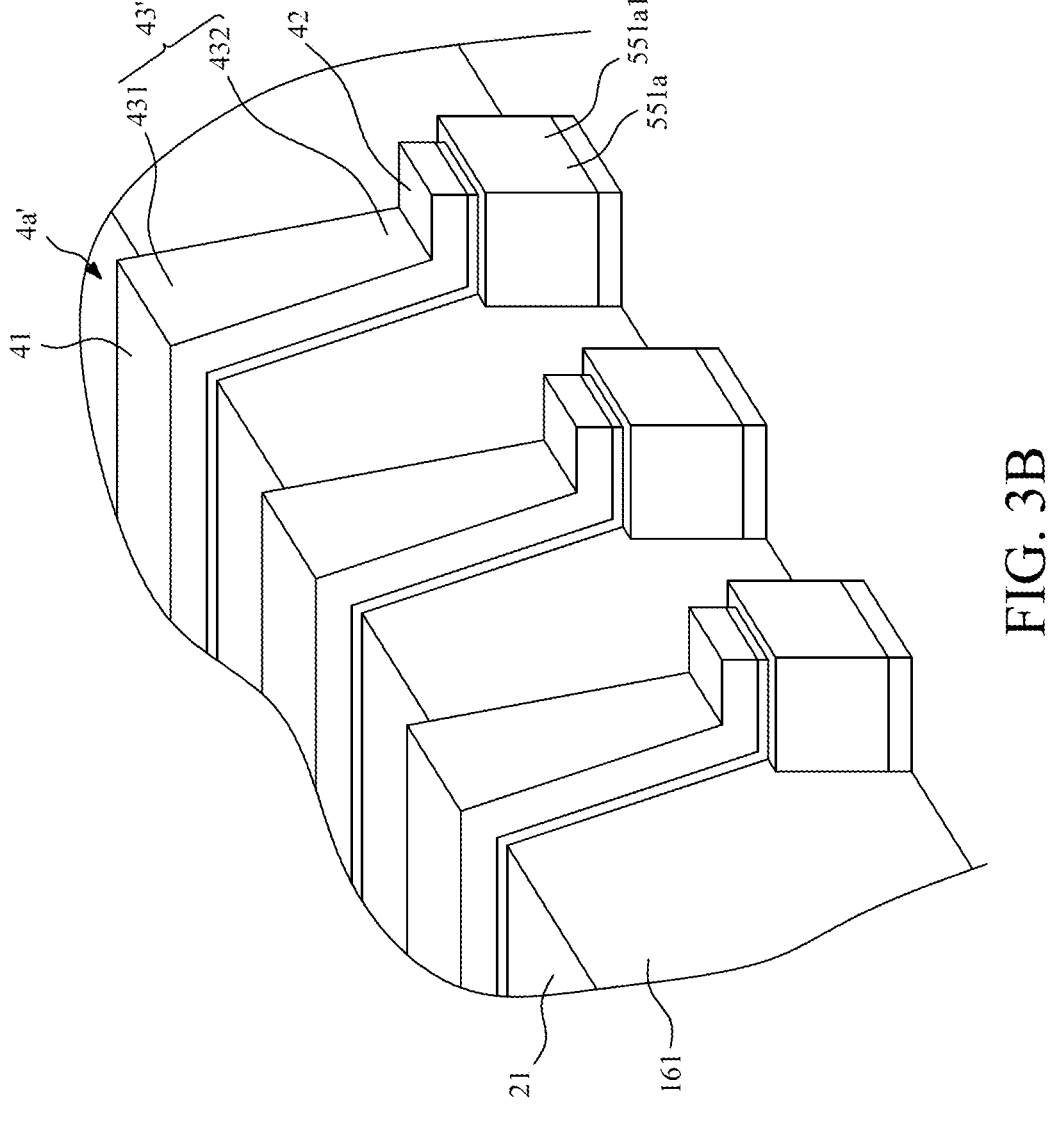
FIG. 3B illustrates a partially enlarged perspective view of an opening of a circuit structure according to some embodiments of the present disclosure.

FIG. 3B illustrates a partially enlarged perspective view of an opening 16*c* of a circuit structure according to some embodiments of the present disclosure. The structure shown in FIG. 3B is similar to the structure shown in FIG. 3, except for a structure of the trace 4'. The structure of the trace 4' shown in FIG. 3B is similar to the structure of the trace 4 shown in FIG. 3, except for a structure of the middle portion 43' of the trace 4'. As shown in FIG. 3B, the middle portion 43' of the trace 4' includes an upper portion 431 connecting the first portion 41 and a lower portion 432 connecting the second portion 42. A width of the upper portion 431 is greater than a width of the lower portion 432. That is, the middle portion 43' of the trace 4' may taper downward from a right side view of FIG. 3B. The middle portion 43' of the trace 4' may taper toward the second portion 42. A width of the first portion 41 may be greater than a width of the second portion 42.

Figure 3C:
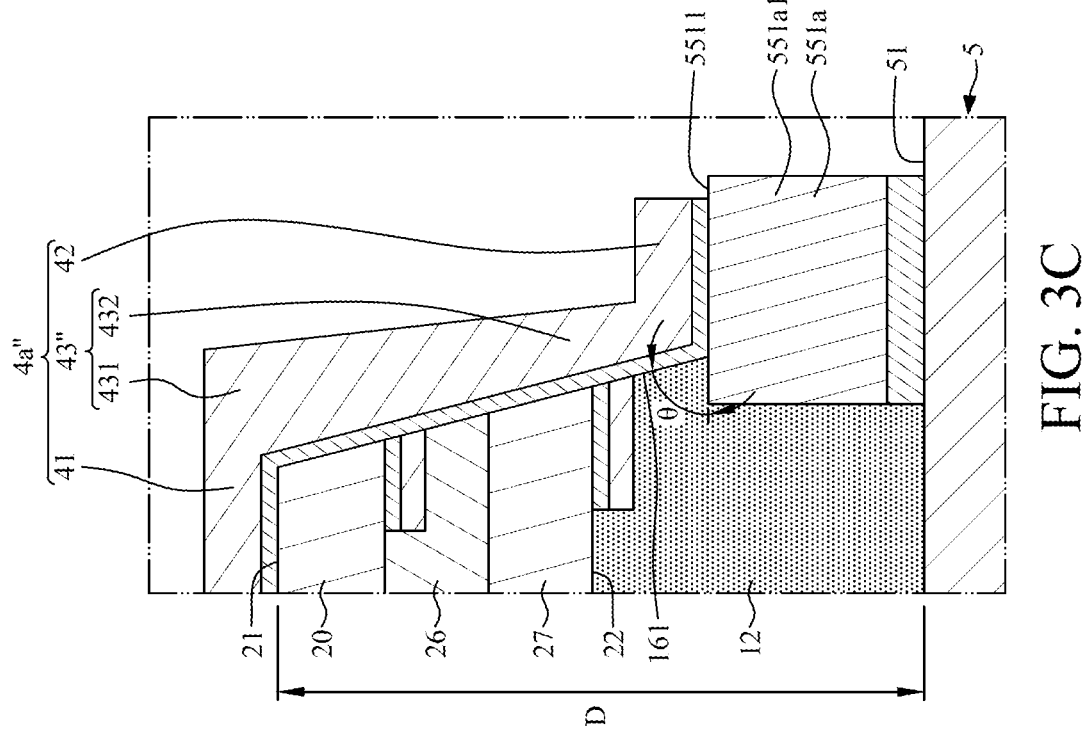
FIG. 3C illustrates a partially enlarged cross-sectional view of a circuit structure according to some embodiments of the present disclosure.

FIG. 3C illustrates a partially enlarged cross-sectional view of a circuit structure according to some embodiments of the present disclosure. The structure of the first trace 4*a*" shown in FIG. 3C is similar to the structure of the first trace 4*a* shown in FIG. 3A, except for a structure of the middle portion 43" of the first trace 4*a*". As shown in FIG. 3C, the middle portion 43" of the first trace 4*a*" includes an upper portion 431 connecting the first portion 41 and a lower portion 432 connecting the second portion 42. A thickness of the upper portion 431 is greater than a thickness of the lower portion 432. That is, the middle portion 43" of the first trace 4*a*" may taper downward in the cross-sectional view. The middle portion 43" of the first trace 4*a*" may taper toward the second portion 42. Thus, in a cross-sectional view, a width of the middle portion 43" of the first trace 4*a*" may taper toward the low-density conductive structure 5. A thickness of the first portion 41 may be substantially equal to a thickness of the second portion 42.

Figure 4:
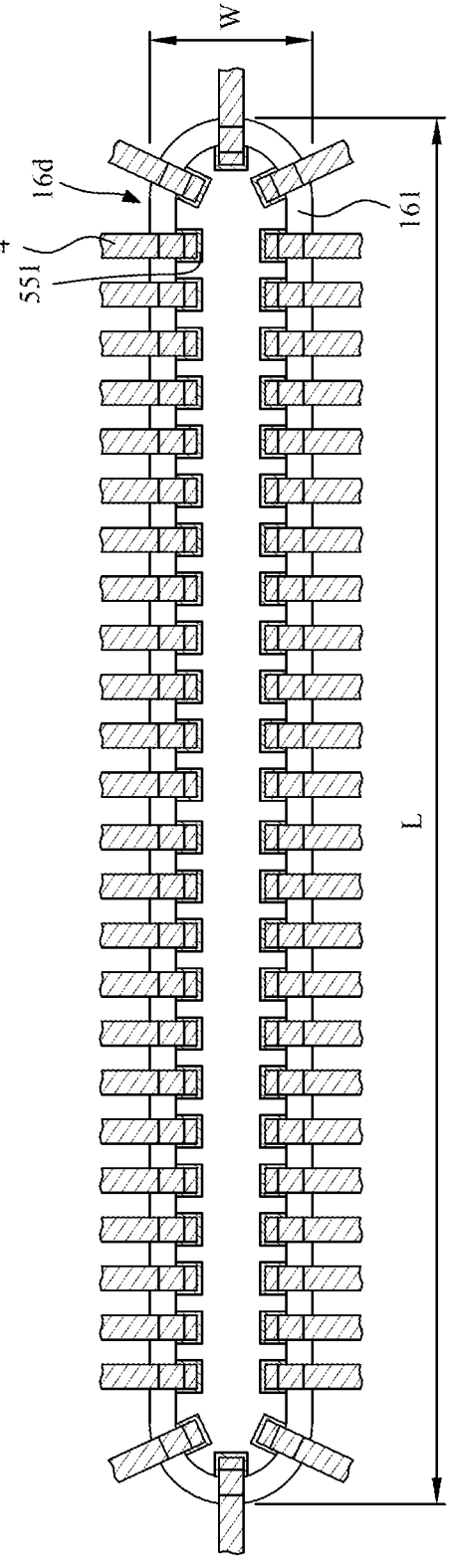
FIG. 4 illustrates a top view of an opening of a circuit structure according to some embodiments of the present disclosure.

FIG. 4 illustrates a top view of an opening 16*d* of a circuit structure according to some embodiments of the present disclosure. The opening 16*d* shown in FIG. 4 is similar to the opening 16*a* shown in FIG. 2, except for a size of the opening 16*d*. The opening 16*d* has a length L and a width W. A ratio of the length L to the width W may be greater than 3:1, 5:1, 10:1 or 20:1. In addition, the amount of the traces 4 in the opening 16*d* may be greater than 50, 100, 300, 600 or 800.

Figure 5:
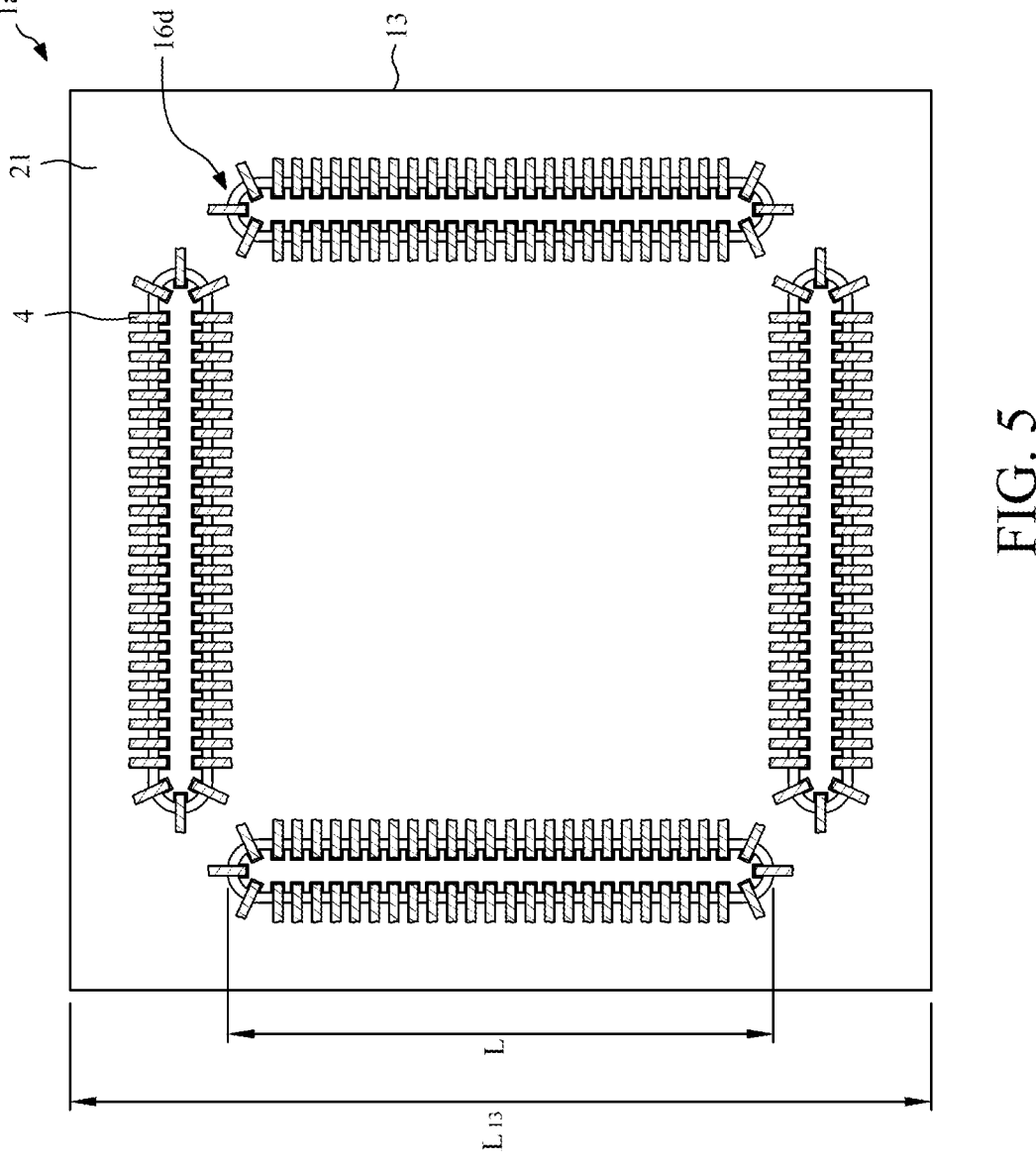
FIG. 5 illustrates a top view of a circuit structure according to some embodiments of the present disclosure.

FIG. 5 illustrates a top view of a circuit structure 1*a* according to some embodiments of the present disclosure. The circuit structure 1*a* may have four edges 13 and may include four openings 16*d*. The length L of the opening 16*d* may be greater than one half of a length $L_{13}$ of the edge 13. Each of the openings 16*d* may be parallel with a respective one of the edges 13. Each of the openings 16*d* may be disposed adjacent to the respective one of the edges 13.

Figure 6:
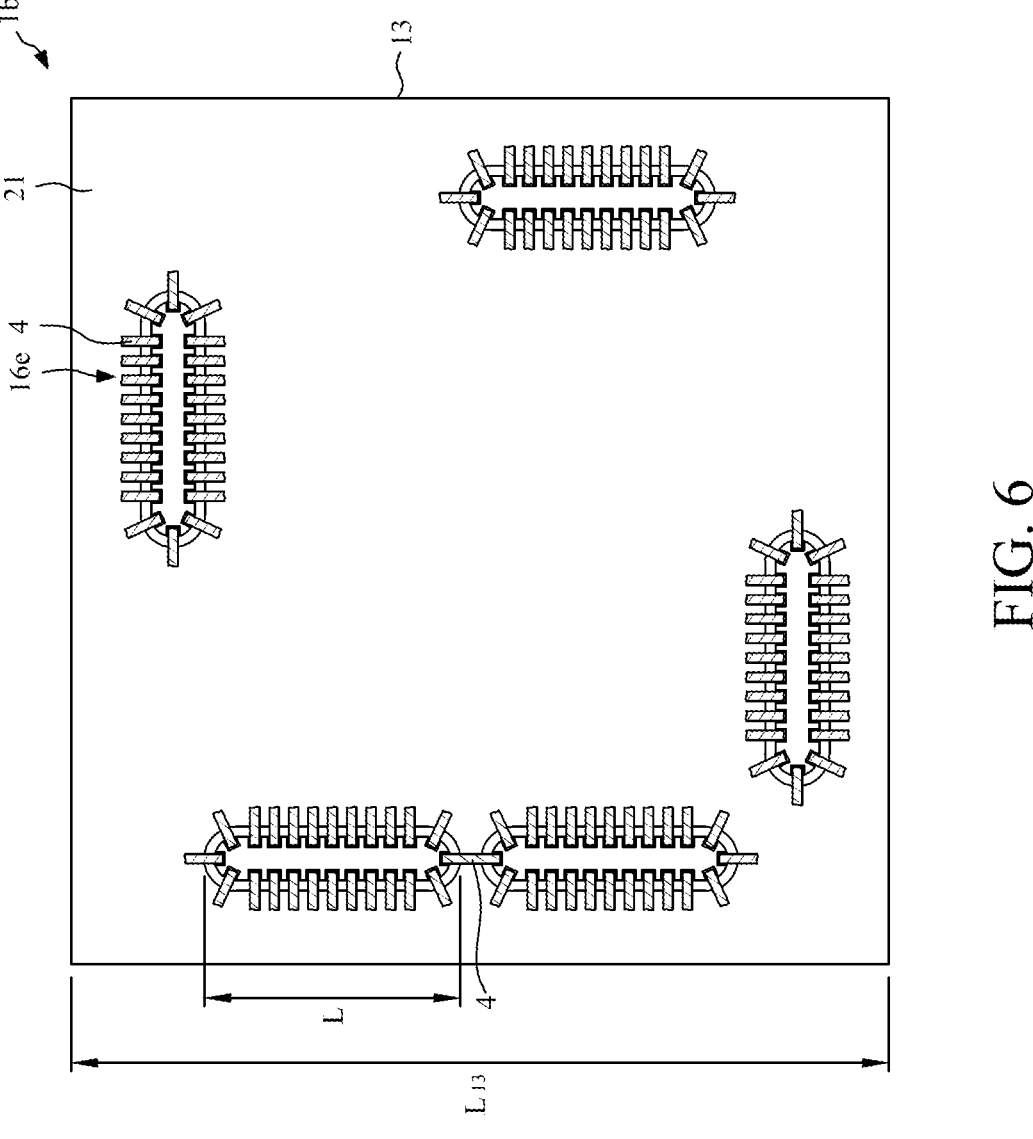
FIG. 6 illustrates a top view of a circuit structure according to some embodiments of the present disclosure.

FIG. 6 illustrates a top view of a circuit structure 1*b* according to some embodiments of the present disclosure. The circuit structure 1*b* may have four edges 13 and may include five openings 16*e*. The length L of the opening 16*e* may be less than one half of a length $L_{13}$ of the edge 13. Each of the openings 16*e* may be parallel with a respective one of the edges 13. Each of the openings 16*e* may be disposed adjacent to the respective one of the edges 13. Two openings 16*e* may be arranged in a row, and a trace 4 may extend into the two openings 16*e*.

Figure 7:
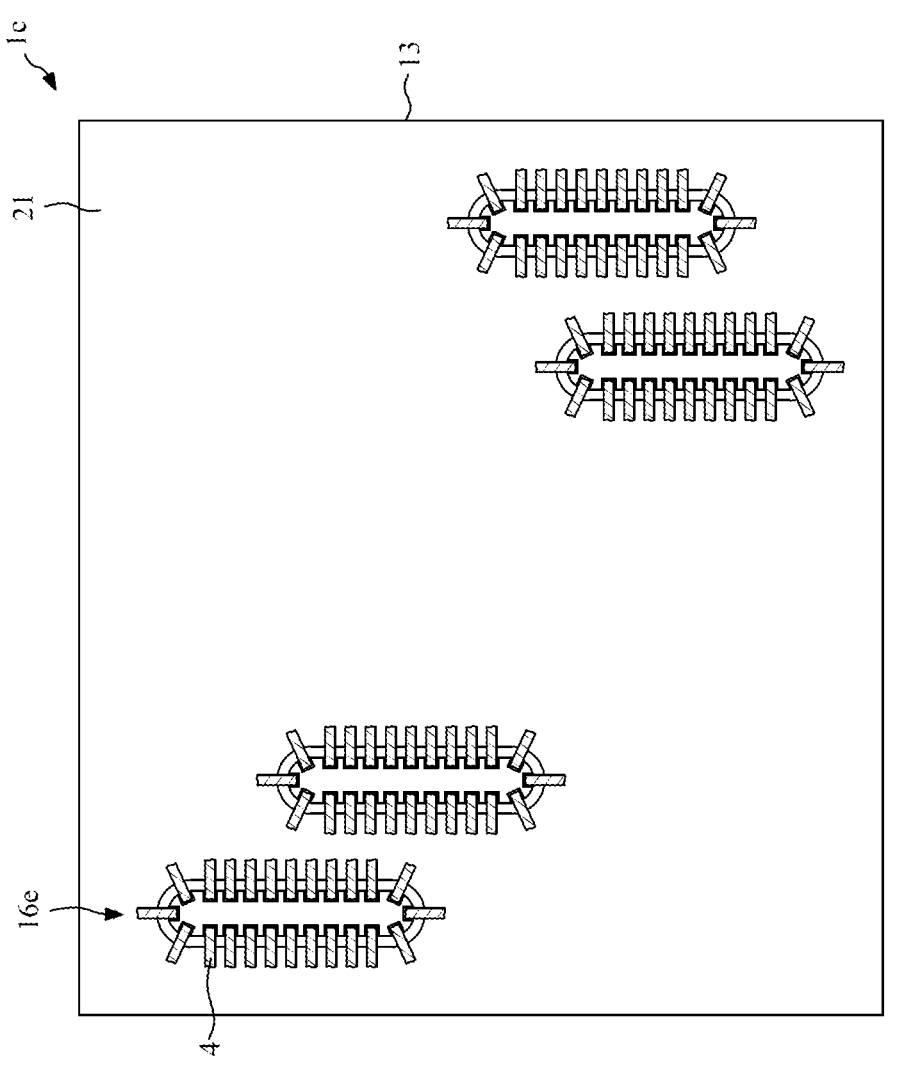
FIG. 7 illustrates a top view of a circuit structure according to some embodiments of the present disclosure.

FIG. 7 illustrates a top view of a circuit structure 1*c* according to some embodiments of the present disclosure. The circuit structure 1*c* may have four edges 13 and may include four openings 16*e*. The length L of the opening 16*e* may be less than one half of a length of the edge 13. The openings 16*e* may be parallel with the edges 13. The openings 16*e* may be arranged in parallel. Two of the openings 16*e* may be disposed adjacent to one edge 13, and the other two of the openings 16*e* may be disposed adjacent to another edge 13.

Figure 8:
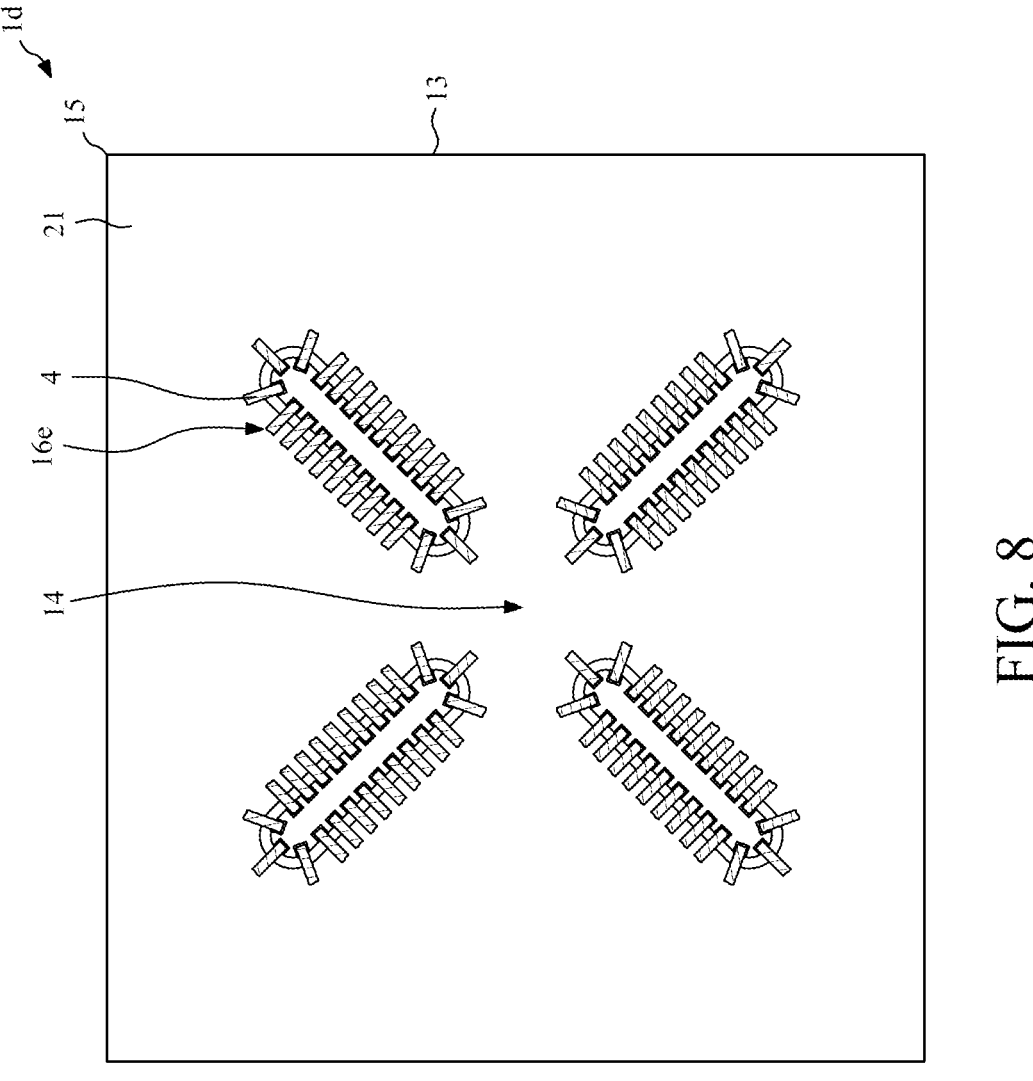
FIG. 8 illustrates a top view of a circuit structure according to some embodiments of the present disclosure.

FIG. 8 illustrates a top view of a circuit structure 1*d* according to some embodiments of the present disclosure. The circuit structure 1*d* may have four edges 13, a center 14 and four corners 15, and may include four openings 16*e*. The length L of the opening 16*e* may be less than one half of a length of the edge 13. The opening 16*e* may be arranged in a direction extending from the center 14 toward the corner 15. Thus, the four openings 16*e* may be arranged radially.

Figure 9:
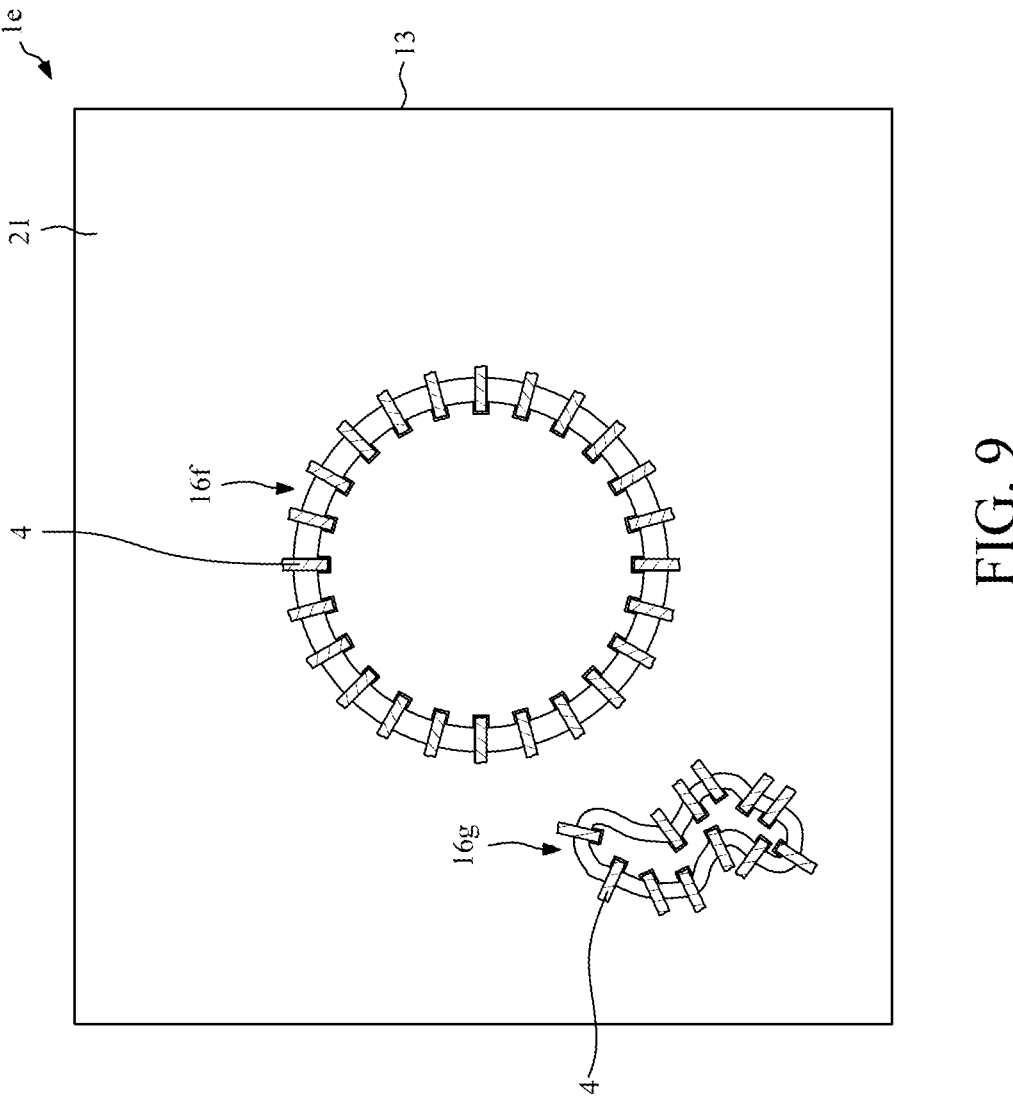
FIG. 9 illustrates a top view of a circuit structure according to some embodiments of the present disclosure.

FIG. 9 illustrates a top view of a circuit structure 1*e* according to some embodiments of the present disclosure. The circuit structure 1*e* may include an opening 16*f* and an opening 16*g*. The opening 16*f* may be in a circular shape. The opening 16*g* may be in an irregular shape.

Figure 10:
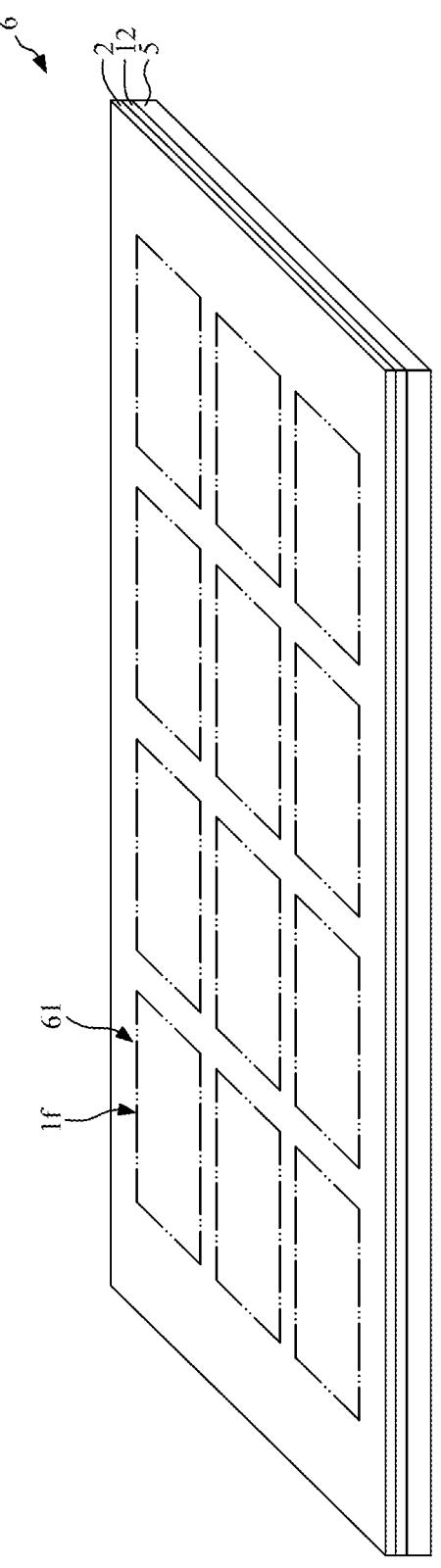
FIG. 10 illustrates a perspective view of a panel structure according to some embodiments of the present disclosure.

FIG. 10 illustrates a perspective view of a panel structure 6 according to some embodiments of the present disclosure. The panel structure 6 may include a high-density conductive structure 2, an adhesion layer 12 and a low-density conductive structure 5. The high-density conductive structure 2, the adhesion layer 12 and the low-density conductive structure 5 of the panel structure 6 in FIG. 10 may be similar to the high-density conductive structure 2, the adhesion layer 12 and the low-density conductive structure 5 of the circuit structure 1 in FIG. 1, respectively. The panel structure 6 may include a plurality of units 61 arranged in an array. Each of the units 61 may include a circuit structure 1*f* as shown in FIG. 10A.

Figure 10A:
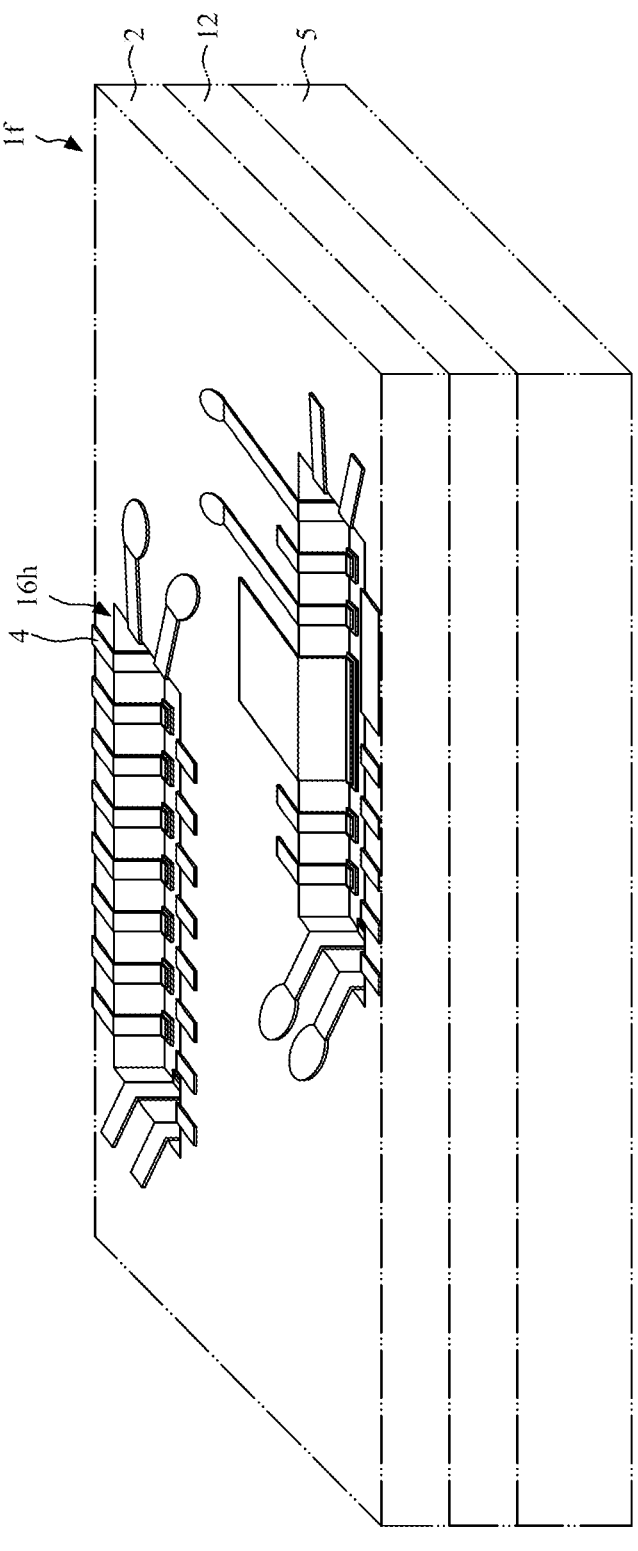
FIG. 10A illustrates an example of a perspective view of the circuit structure of FIG. 10.

FIG. 10A illustrates an example of a perspective view of the circuit structure 1*f* of FIG. 10. The circuit structure 1*f* may include a high-density conductive structure 2, an adhesion layer 12 and a low-density conductive structure 5. The high-density conductive structure 2 may define at least one opening 16*h*, and may include a plurality of traces 4 extending into the at least one opening 16*h*. The high-density conductive structure 2, the adhesion layer 12, the low-density conductive structure 5, the opening 16*h*, and the traces 4 of the circuit structure 1*f* in FIG. 10A may be similar to the high-density conductive structure 2, the adhesion layer 12, the low-density conductive structure 5, the opening 16, and the traces 4 of the circuit structure 1 in FIG. 1, respectively.

Figure 11:
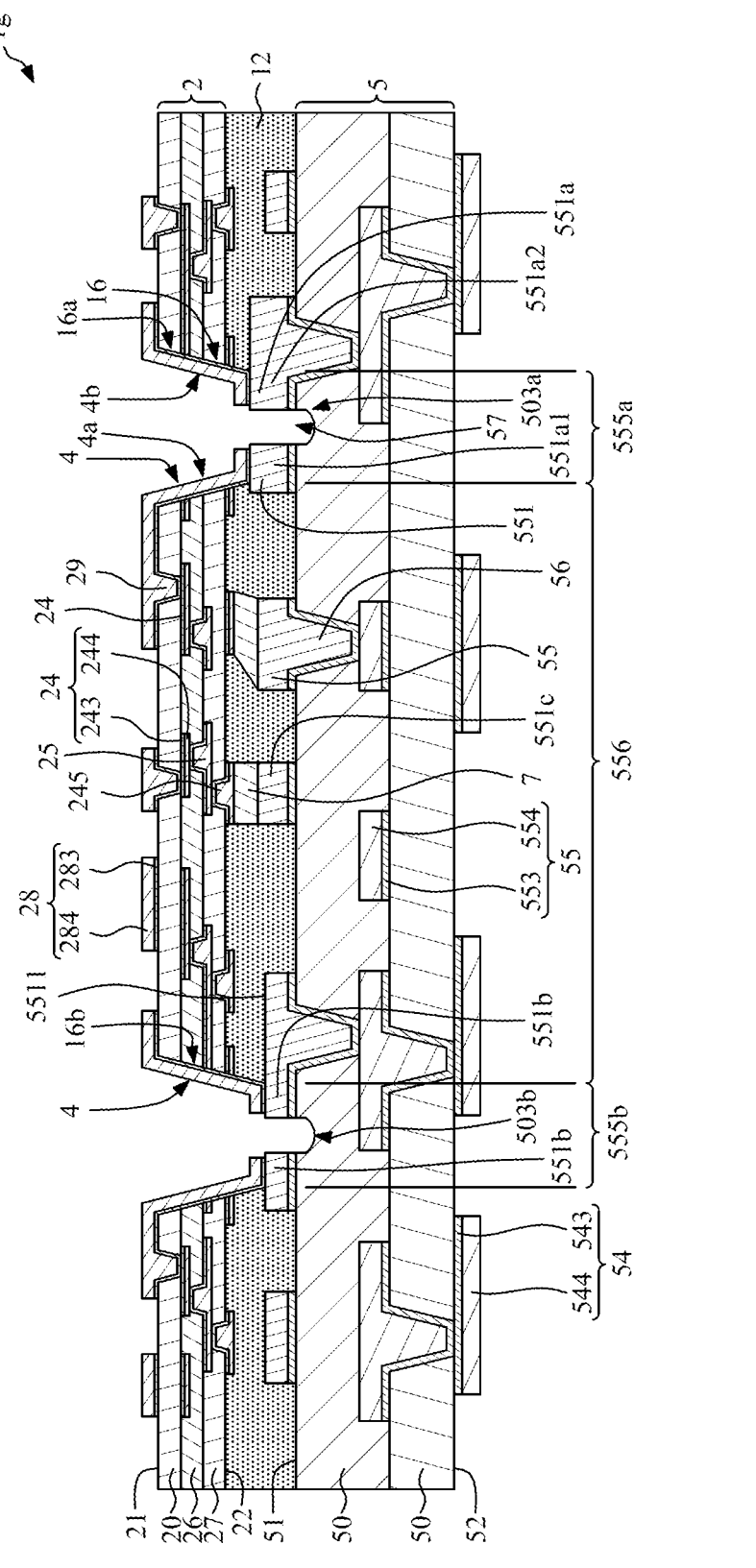
FIG. 11 illustrates a cross-sectional view of a circuit structure according to some embodiments of the present disclosure.

FIG. 11 illustrates a cross-sectional view of a circuit structure 1*g* according to some embodiments of the present disclosure. The circuit structure 1*g* of FIG. 11 is similar to the circuit structure 1 shown in FIG. 1, and the differences therebetween are described below. As shown in FIG. 11, a topmost dielectric layer 50 of the low-density conductive structure 5 may define a recess portion 503*a*, 503*b* between two of the topmost pads 551 (e.g., the first pads 551*a* and the second pads 551*b*) of the low-density conductive structure 5. The recess portion 503*a*, 503*b* is in communication with the opening 16 (e.g., the first opening 16*a* and the second opening 16*b*). That is, the opening 16 (e.g., the first opening 16*a* and the second opening 16*b*) may extend into the topmost dielectric layer 50 of the low-density conductive structure 5. For example, the first opening 16*a* may further include a second portion 503*a* (i.e., the recess portion 503*a*)

extending into the topmost dielectric layer 50 of the low-density conductive structure 5.

Figure 12:
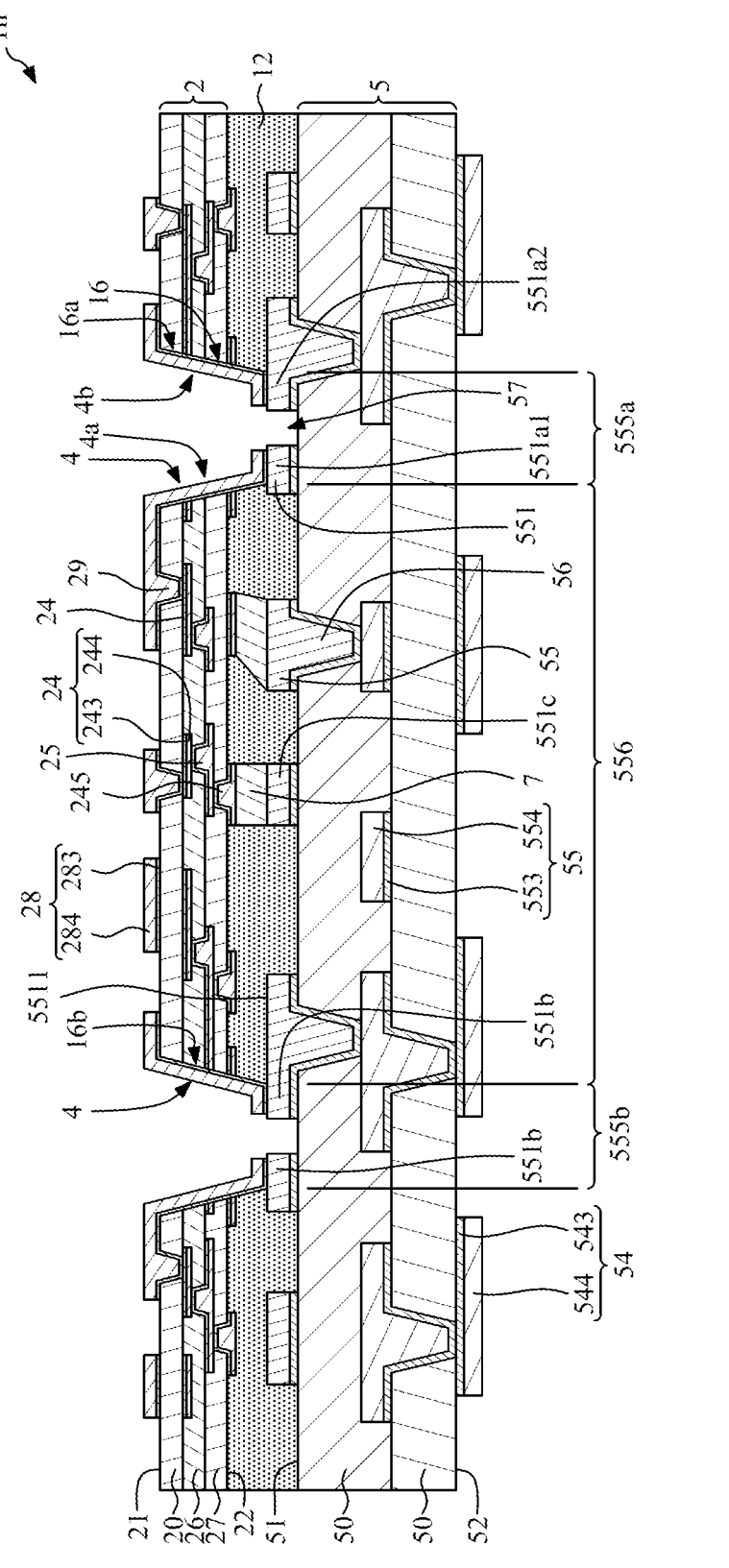
FIG. 12 illustrates a cross-sectional view of a circuit structure according to some embodiments of the present disclosure.

FIG. 12 illustrates a cross-sectional view of a circuit structure 1*h* according to some embodiments of the present disclosure. The circuit structure 1*h* of FIG. 12 is similar to the circuit structure 1 shown in FIG. 1, and the differences therebetween are described below. As shown in FIG. 12, the topmost pads 551 (including the first pad 551*a*, the second pad 551*b* and the third pad 551*c*) of the low-density conductive structure 5 may have a substantially consistent thickness. That is, the thickness of the first pad 551*a*, the thickness of the second pad 551*b* and the thickness of the third pad 551*c* may be substantially equal to each other. The top surface of the first pad 551*a*, the top surface of the second pad 551*b* and the top surface of the third pad 551*c* may be level with each other.

Figure 13:
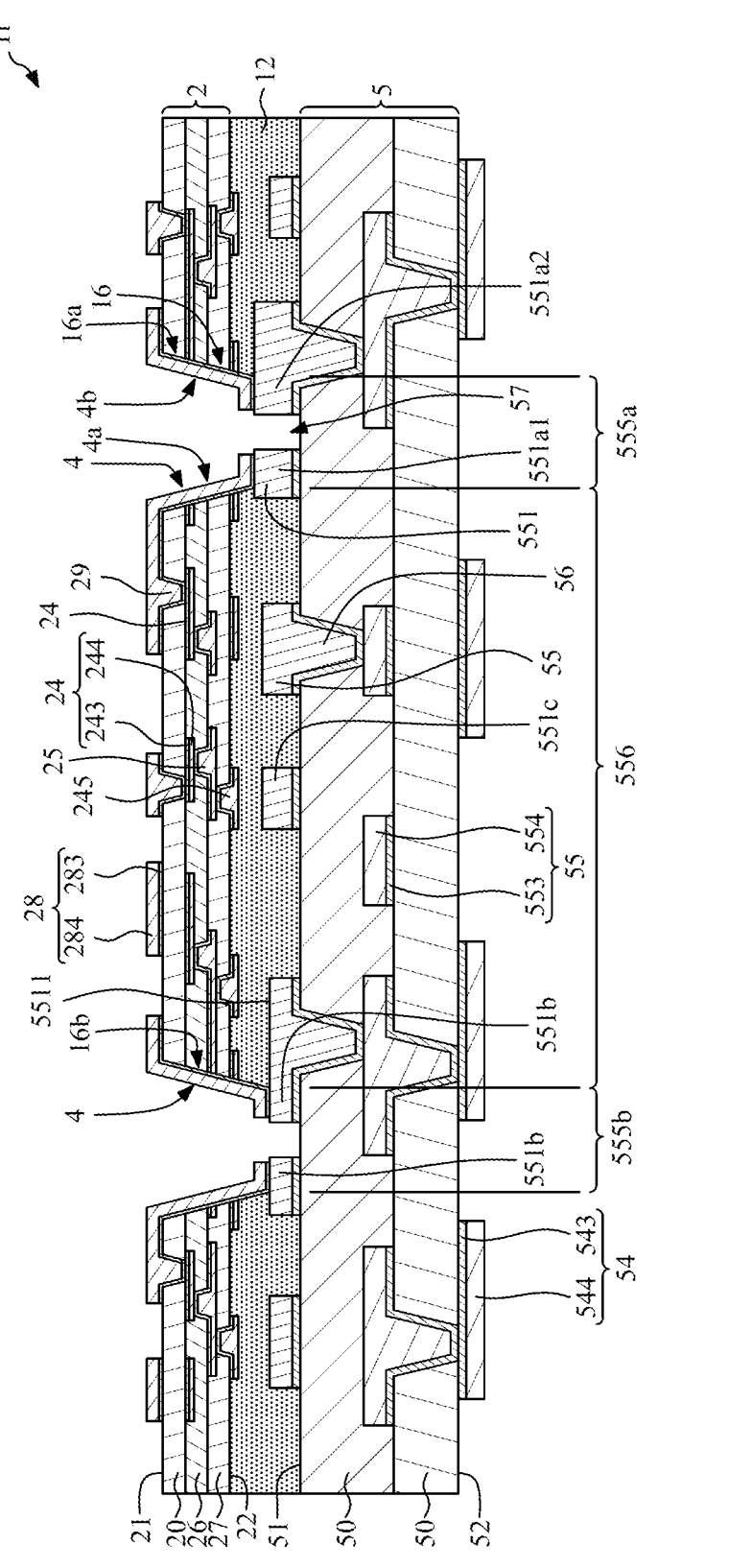
FIG. 13 illustrates a cross-sectional view of a circuit structure according to some embodiments of the present disclosure.

FIG. 13 illustrates a cross-sectional view of a circuit structure 1*i* according to some embodiments of the present disclosure. The circuit structure 1*i* of FIG. 13 is similar to the circuit structure 1 shown in FIG. 1, and the differences therebetween are described below. As shown in FIG. 13, the interconnectors 7 of FIG. 1 may be omitted. Thus, the high-density conductive structure 2 is electrically connected to the low-density conductive structure 5 only through the traces 4.

Figure 14:
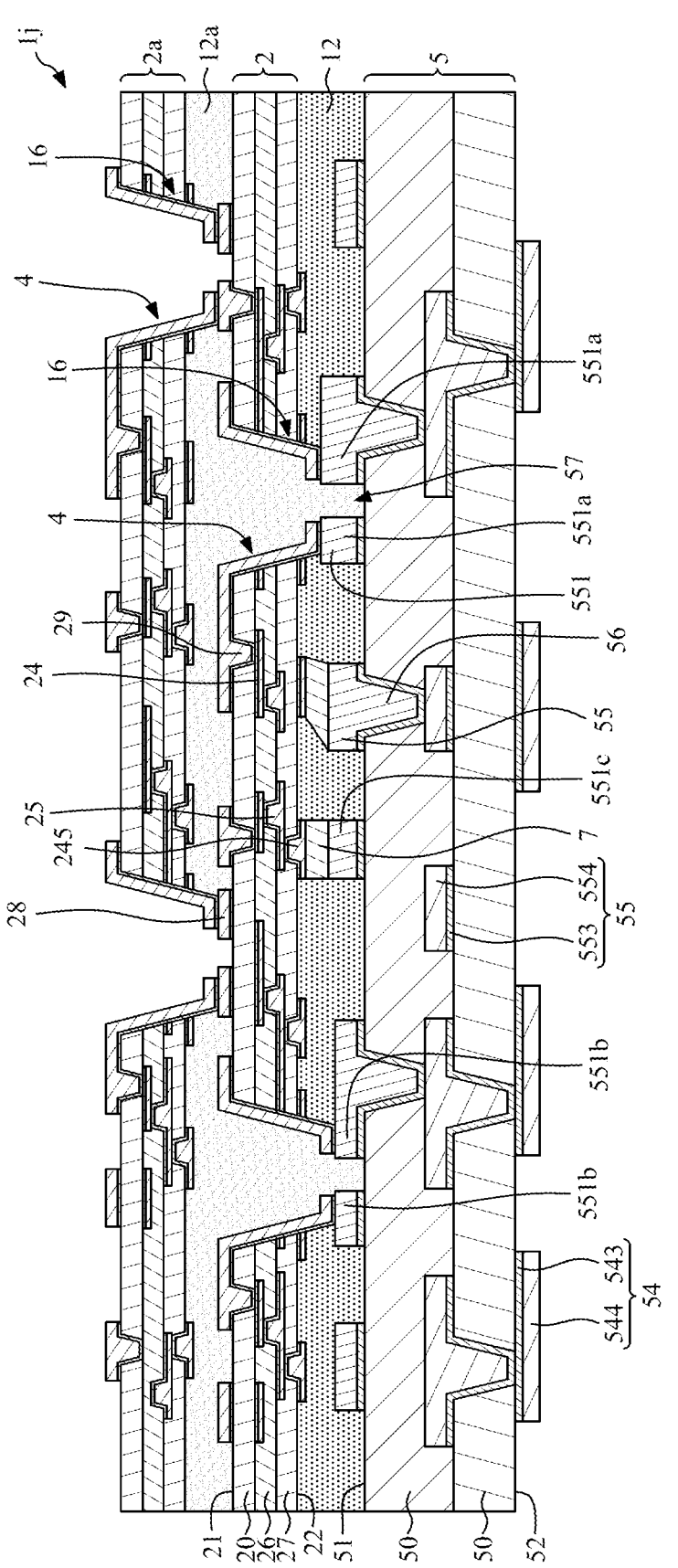
FIG. 14 illustrates a cross-sectional view of a circuit structure according to some embodiments of the present disclosure.

FIG. 14 illustrates a cross-sectional view of a circuit structure 1*j* according to some embodiments of the present disclosure. The circuit structure 1*j* of FIG. 14 is similar to the circuit structure 1 shown in FIG. 1, and the differences therebetween are described below. As shown in FIG. 14, the circuit structure 1*j* may further include an adhesion layer 12*a* and a high-density conductive structure 2*a*. The high-density conductive structure 2*a* is similar to the high-density conductive structure 2, and may define at least one opening 16. The high-density conductive structure 2*a* is bonded to the high-density conductive structure 2 through the adhesion layer 12*a*. The traces 4 of the high-density conductive structure 2*a* extend into the opening 16 of the high-density conductive structure 2*a* and are electrically connected to the outer circuit layer 28 of the high-density conductive structure 2.

Figure 15:
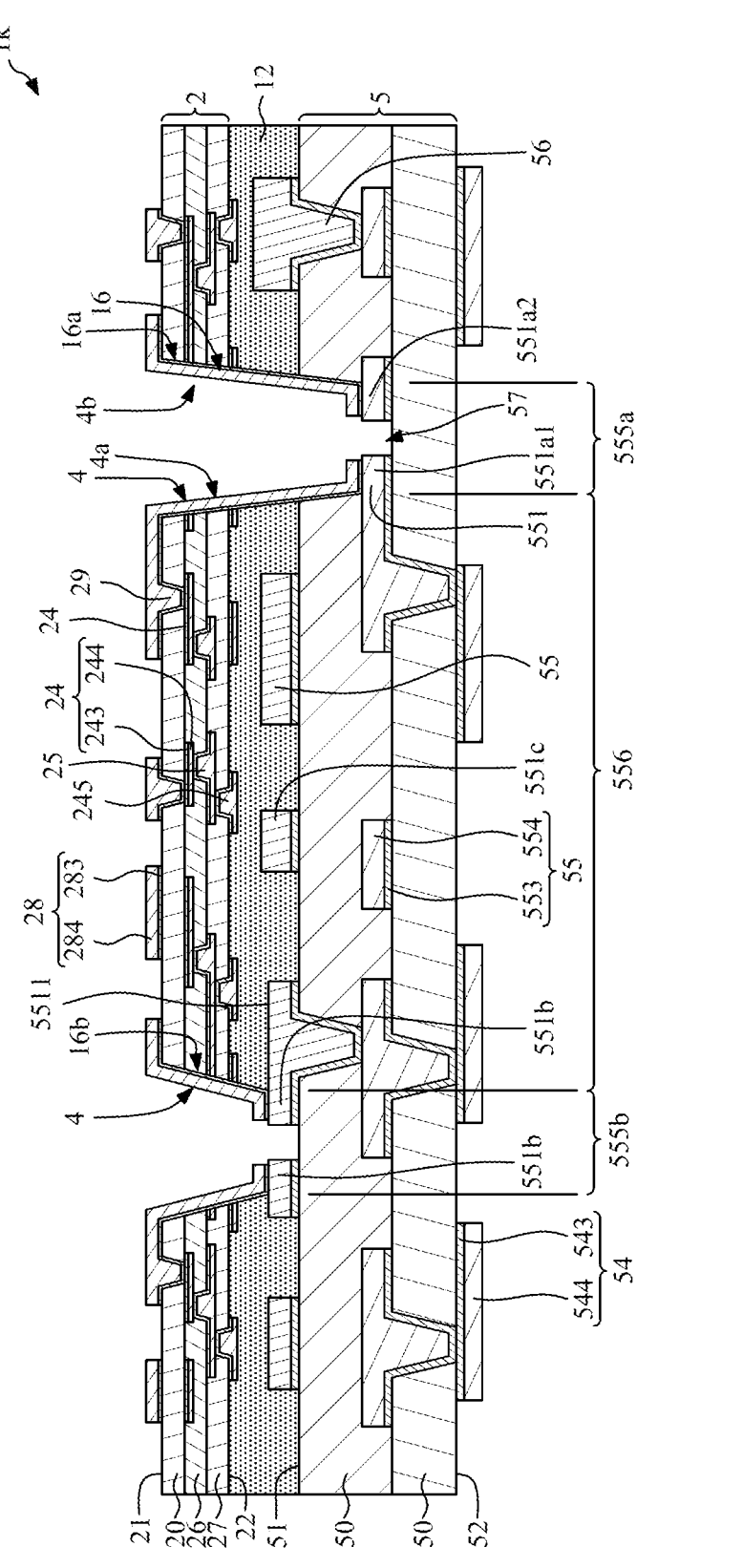
FIG. 15 illustrates a cross-sectional view of a circuit structure according to some embodiments of the present disclosure.

FIG. 15 illustrates a cross-sectional view of a circuit structure 1*k* according to some embodiments of the present disclosure. The circuit structure 1*k* of FIG. 15 is similar to the circuit structure 1 shown in FIG. 1, and the differences therebetween are described below. As shown in FIG. 15, the first opening 16 may extend through the topmost dielectric layer 50 of the low-density conductive structure 5 to expose a portion of an inner upper circuit layer 55 rather than a topmost upper circuit layer 55 of the low-density conductive structure 5.

Figure 15A:
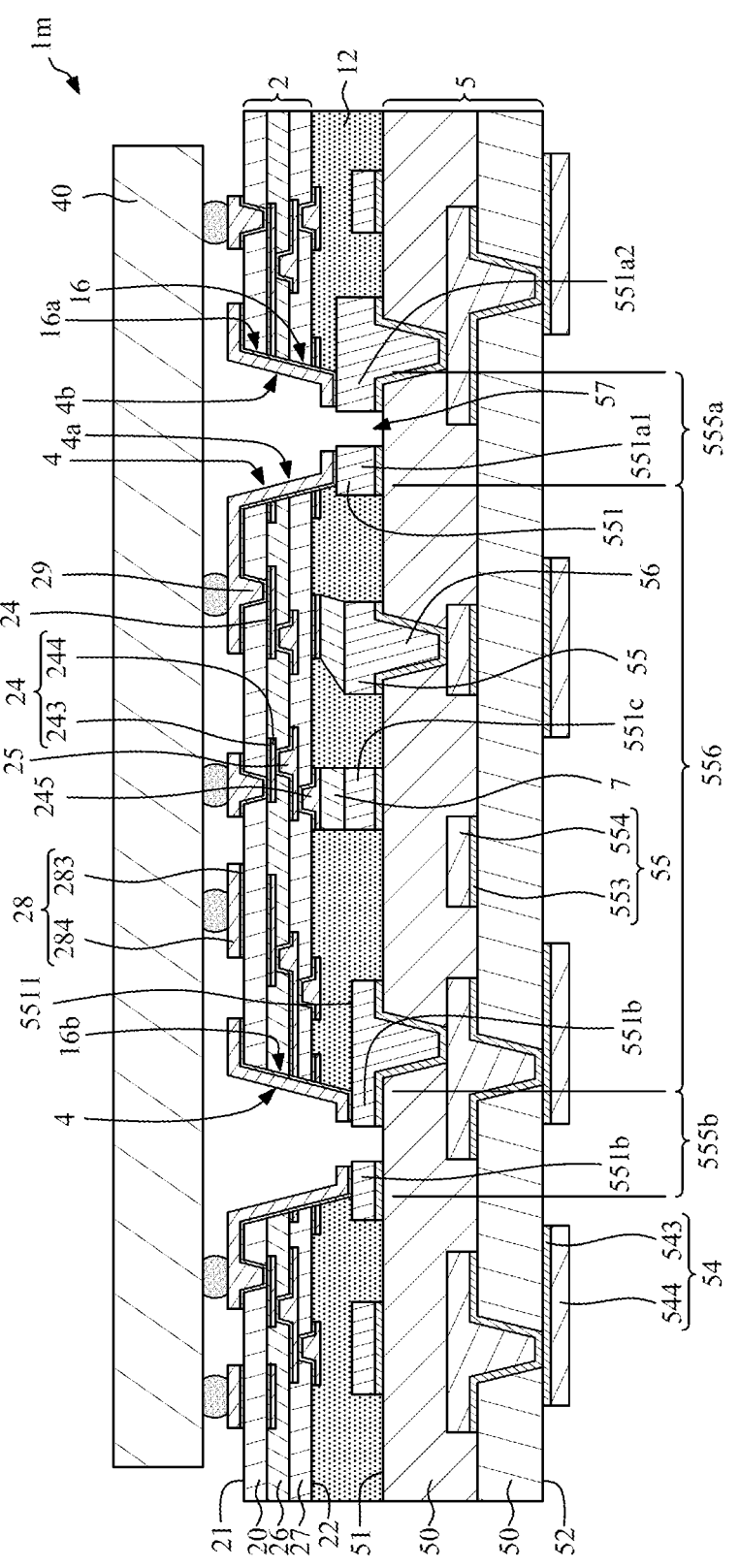
FIG. 15A illustrates a cross-sectional view of a circuit structure according to some embodiments of the present disclosure.

FIG. 15A illustrates a cross-sectional view of a circuit structure 1*m* according to some embodiments of the present disclosure. The circuit structure 1*m* of FIG. 15A is similar to the circuit structure 1 of FIG. 1, except that an electronic component 40 may be included. The circuit structure 1*m* of FIG. 15A may be also referred to as "an electronic package structure." The electronic component 40 is disposed over the high-density conductive structure 2. In some embodiments, the first trace 4*a* with greater width is configured to transmit a power to the electronic component 40, and the second trace 4*b* with smaller width is configured to transmit signals to the electronic component 40.

Figure 15B:
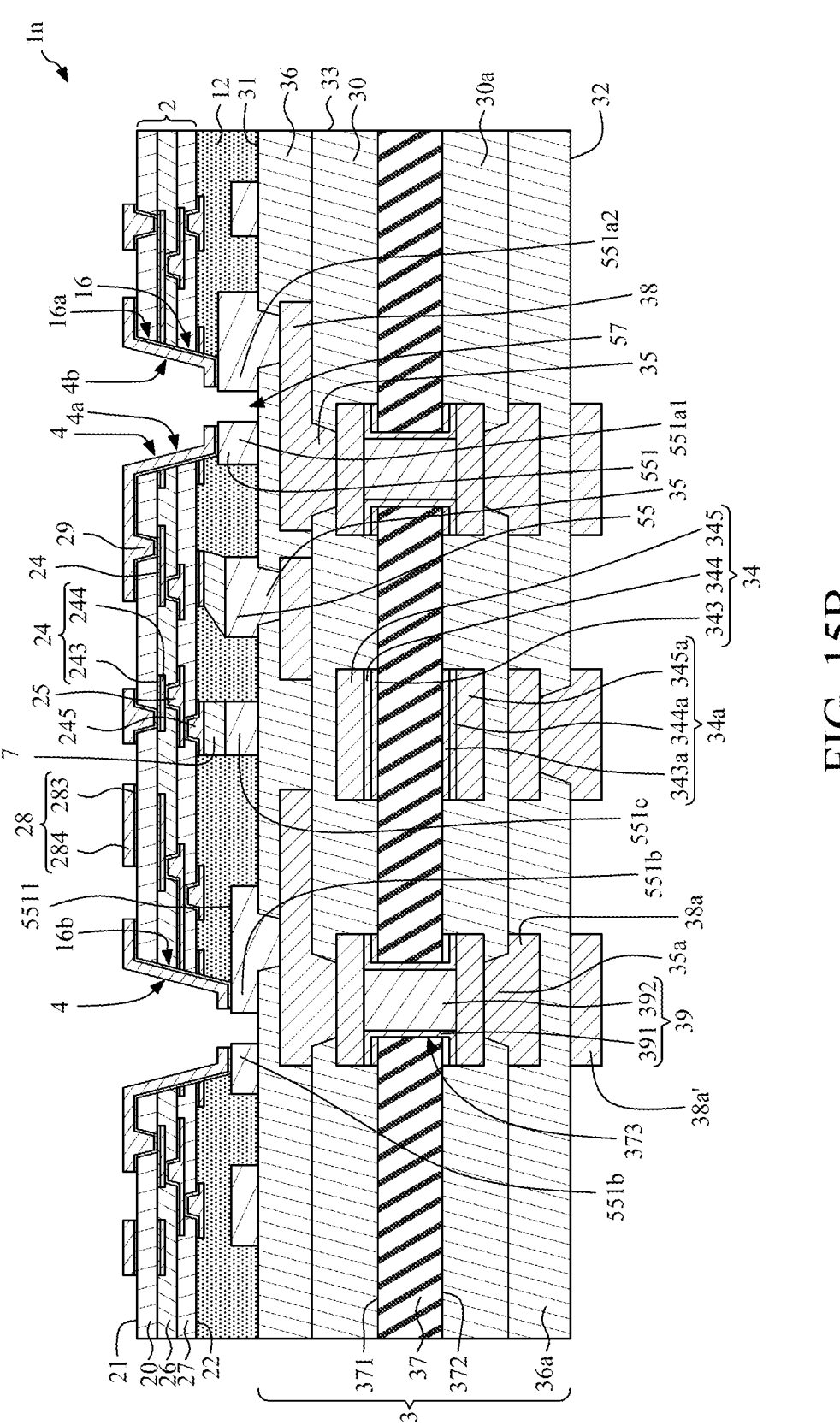
FIG. 15B illustrates a cross-sectional view of a circuit structure according to some embodiments of the present disclosure.

FIG. 15B illustrates a cross-sectional view of a circuit structure In according to some embodiments of the present disclosure. The circuit structure In of FIG. 15B is similar to the circuit structure 1 shown in FIG. 1, except that the low-density conductive structure 5 of FIG. 1 is replaced by the low-density conductive structure 3 of FIG. 15B. The low-density conductive structure 5 may be also referred to as "a core substrate." As shown in FIG. 15B, the low-density conductive structure 3 includes at least one dielectric layer (including, for example, one first upper dielectric layer 30, one second upper dielectric layer 36, one first lower dielectric layer 30*a* and one second lower dielectric layer 36*a*), at least one circuit layer (including, for example, one first upper circuit layer 34, two second upper circuit layers 38, 55, one first lower circuit layer 34*a* and two second lower circuit layers 38*a*, 38*a*' formed of a metal, a metal alloy, or other conductive material) in contact with the dielectric layer 30, 36, 30*a*, 36*a*, and at least one inner conductive via (including, for example, a plurality of upper interconnection vias 35 and a plurality of lower interconnection vias 35*a*). In some embodiments, the low-density conductive structure 3 may be similar to a core substrate that further includes a core portion 37. The core portion 37 may be an organic substrate. The circuit layer 34, 38, 55, 34*a*, 38*a*, 38*a*' of the low-density conductive structure 3 may be also referred to as "a low-density circuit layer". As shown in FIG. 15B, the low-density conductive structure 3 has a top surface 31, a bottom surface 32 opposite to the top surface 31, and a lateral surface 33 extending between the top surface 31 and the bottom surface 32.

The core portion 37 has a top surface 371 and a bottom surface 372 opposite to the top surface 371, and defines a plurality of first through holes 373 extending through the core portion 37. An interconnection via 39 is disposed or formed in each first through hole 373 for vertical connection. In some embodiments, the interconnection via 39 includes a base metallic layer 391 and an insulation material 392. The base metallic layer 391 is disposed or formed on a side wall of the first through hole 373, and defines a central through hole. The insulation material 392 fills the central through hole defined by the base metallic layer 391. In some embodiments, the interconnection via 39 may omit an insulation material, and may include a bulk metallic material that fills the first through hole 373.

The first upper dielectric layer 30 is disposed on the top surface 371 of the core portion 37. The second upper dielectric layer 36 is stacked or disposed on the first upper dielectric layer 30. In addition, the first lower dielectric layer 30*a* is disposed on the bottom surface 372 of the core portion 37. The second lower dielectric layer 36*a* is stacked or disposed on the first lower dielectric layer 30*a*.

An L/S of the first upper circuit layer 34 may be greater than or equal to about 10 μm/about 10 μm. Thus, the L/S of the first upper circuit layer 34 may be greater than or equal to about five times the L/S of the circuit layers 24 of the high-density conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. Each upper interconnection via 35 tapers downwardly along a direction from the top surface 31 towards the bottom surface 32 of the low-density conductive structure 3.

In addition, in some embodiments, the second upper circuit layer 55 is disposed on the second upper dielectric layer 36. In some embodiments, the second upper circuit layer 55 of FIG. 15B may be similar to the topmost upper circuit layers 55 of the low-density conductive structure 5 of FIG. 1, and may include the topmost pads 551 (including the first pads 551a, the second pads 551b and the third pads 551c). In some embodiments, the second upper circuit layer 38 is electrically connected to the second upper circuit layer 55 through the upper interconnection vias 35.

An L/S of the first lower circuit layer 34a may be greater than or equal to about 10 μm/about 10 μm. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. The lower interconnection via 35a tapers upwardly along a direction from the bottom surface 32 towards the top surface 31 of the low-density conductive structure 3. In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed concurrently.

Figure 15C:
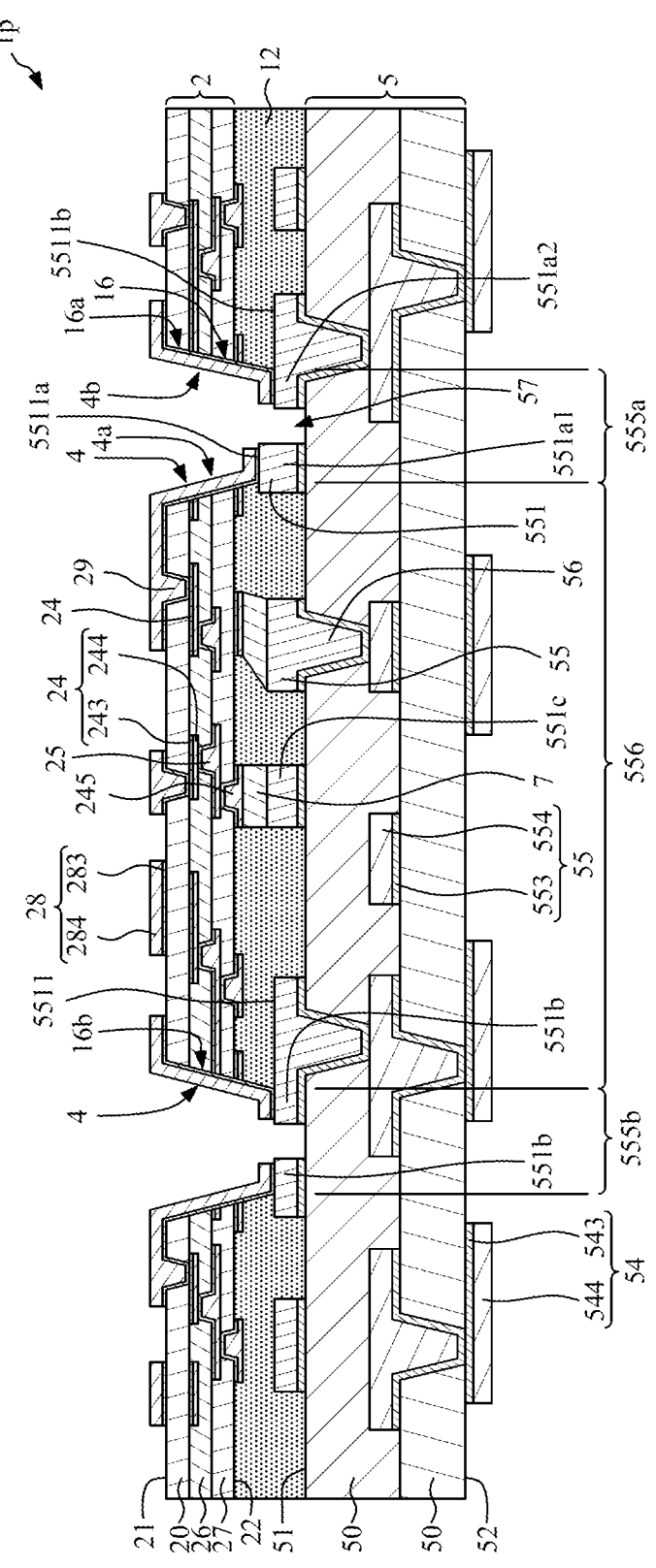
FIG. 15C illustrates a cross-sectional view of a circuit structure according to some embodiments of the present disclosure.

FIG. 15C illustrates a cross-sectional view of a circuit structure 1p according to some embodiments of the present disclosure. The circuit structure 1p of FIG. 15C is similar to the circuit structure 1 of FIG. 1, and the differences are described as follows. The first pad 551al has a first top surface 5511a, and the second pad 551a2 has a second top surface 5511b. A thickness of the first pad 551al may be different from a thickness of the second pad 551a2. Thus, a level or an elevation of the first top surface 5511a of the first pad 551al is different from a level or an elevation of the second top surface 5511b of the second pad 551a2.

FIG. 16 through FIG. 39 illustrate a method for manufacturing a circuit structure according to some embodiments of the present disclosure. In some embodiments, the method is for manufacturing the circuit structure 1 shown in FIG. 1.

Figure 16:
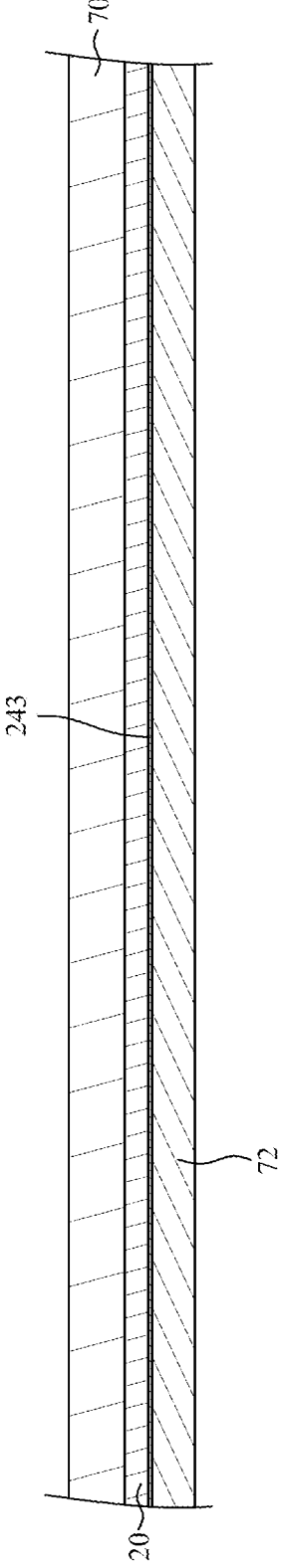
FIG. 16 illustrates one or more stages of an example of a method for manufacturing a circuit structure according to some embodiments of the present disclosure.

Referring to FIG. 16 through FIG. 24, a high-density conductive structure 2' is provided. The high-density conductive structure 2' is manufactured as follows. Referring to FIG. 16, a carrier 70 is provided. The carrier 70 may be a glass carrier, and may be in a wafer type, a panel type or a strip type. Then, a first dielectric layer 20 is formed or disposed on the carrier 70 by a coating or other suitable techniques. Then, a seed layer 243 is formed or disposed on the first dielectric layer 20 by a physical vapor deposition (PVD) technique or other suitable techniques. Then, a photoresist layer 72 is formed or disposed on the seed layer 243 by a coating technique or other suitable techniques.

Figure 17:
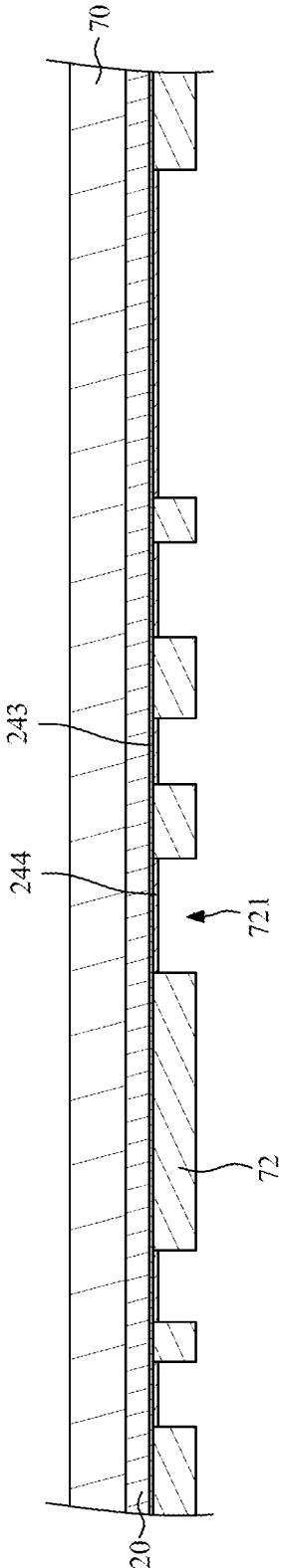
FIG. 17 illustrates one or more stages of an example of a method for manufacturing a circuit structure according to some embodiments of the present disclosure.

Referring to FIG. 17, the photoresist layer 72 is patterned to form a plurality of openings 721 to expose portions of the seed layer 243 by a lithography technique or other suitable techniques. Then, a conductive material 244 is formed or disposed on the exposed portions of the seed layer 243 in the openings 721 of the photoresist layer 72 by a plating technique or other suitable techniques.

Figure 18:
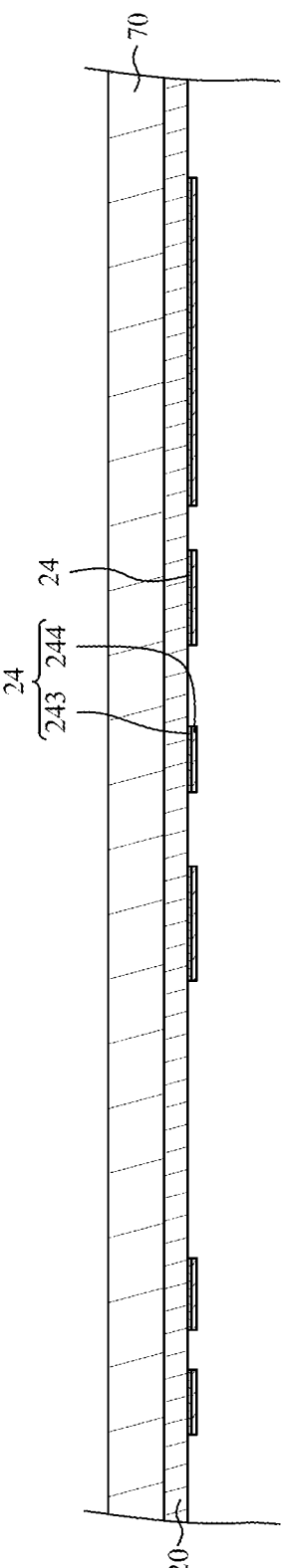
FIG. 18 illustrates one or more stages of an example of a method for manufacturing a circuit structure according to some embodiments of the present disclosure.

Referring to FIG. 18, the photoresist layer 72 is removed by a stripping technique or other suitable techniques. Then, portions of the seed layer 243 that are not covered by the conductive material 244 are removed by an etching technique or other suitable techniques. Meanwhile, an inner circuit layer 24 is formed.

Figure 19:
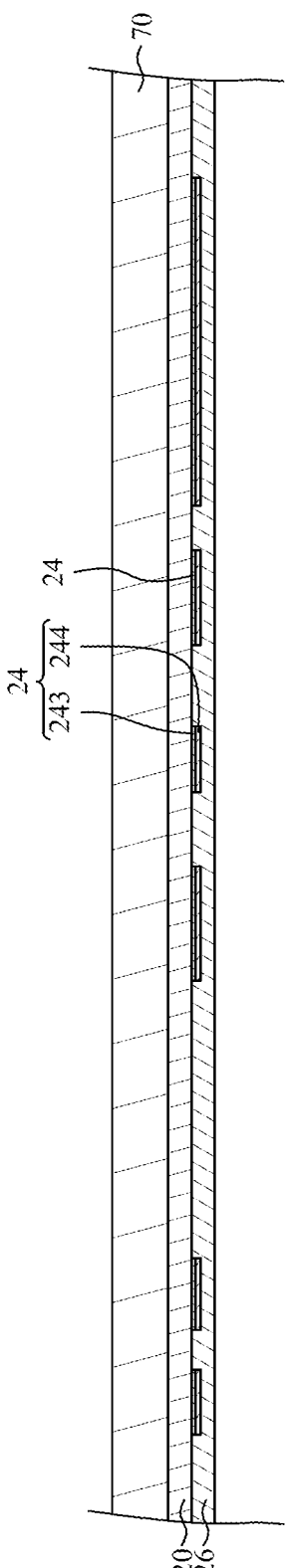
FIG. 19 illustrates one or more stages of an example of a method for manufacturing a circuit structure according to some embodiments of the present disclosure.

Referring to FIG. 19, a second dielectric layer 26 is formed or disposed on the first dielectric layer 20 to cover the inner circuit layer 24 by a coating technique or other suitable techniques.

Figure 20:
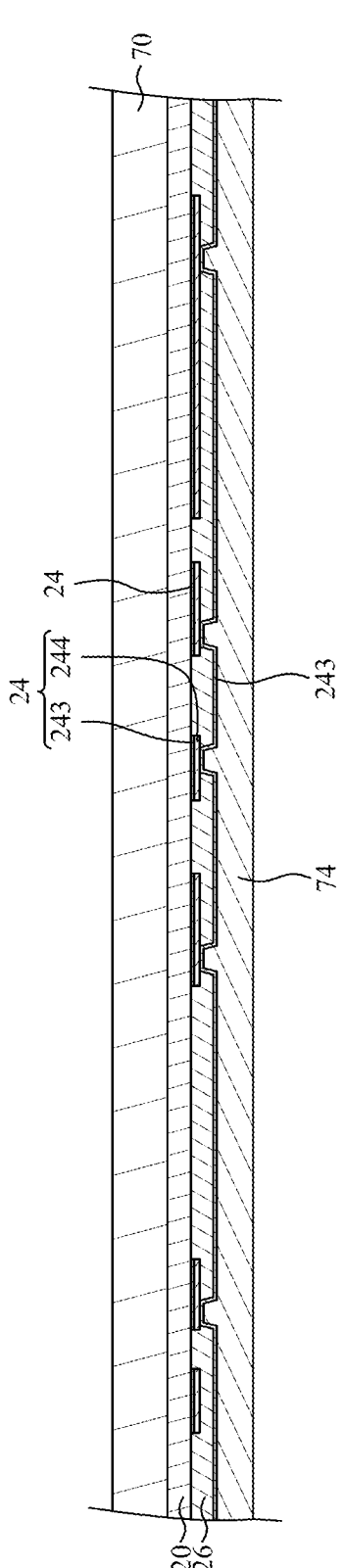
FIG. 20 illustrates one or more stages of an example of a method for manufacturing a circuit structure according to some embodiments of the present disclosure.

Referring to FIG. 20, the second dielectric layer 26 is patterned to form a plurality of openings 261 to expose portions of the conductive material 244 of the inner circuit layer 24 by a lithography technique or other suitable techniques. Then, a seed layer 243 is formed or disposed on the second dielectric layer 26 and in the openings 261 to contact the exposed portions of the conductive material 244 of the inner circuit layer 24 by a physical vapor deposition (PVD) technique or other suitable techniques. Then, a photoresist layer 74 is formed or disposed on the seed layer 243 by a coating technique or other suitable techniques.

Figure 21:
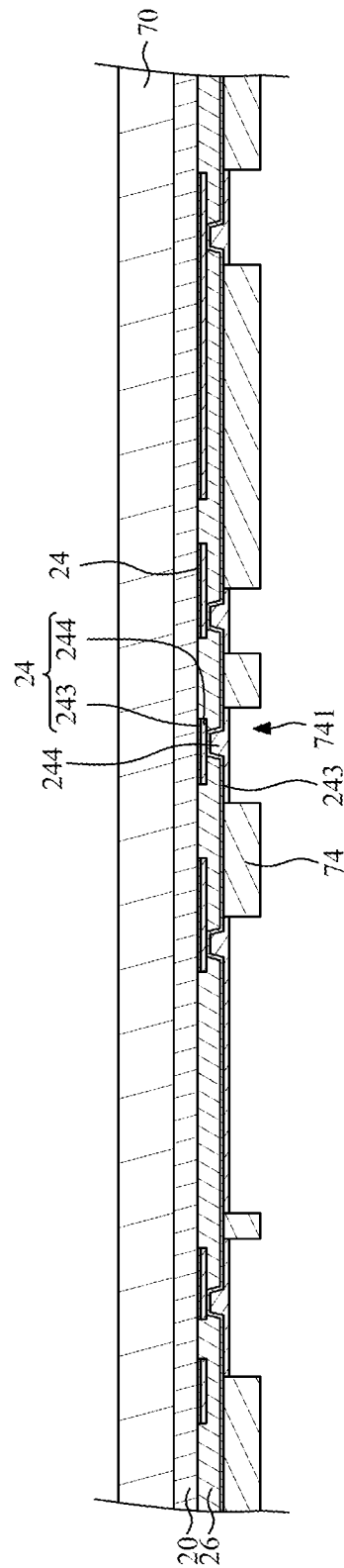
FIG. 21 illustrates one or more stages of an example of a method for manufacturing a circuit structure according to some embodiments of the present disclosure.

Referring to FIG. 21, the photoresist layer 74 is patterned to form a plurality of openings 741 to expose portions of the seed layer 243 by a lithography technique or other suitable techniques. Then, a conductive material 244 is formed or disposed on the exposed portions of the seed layer 243 in the openings 741 of the photoresist layer 74 by a plating technique or other suitable techniques.

Figure 22:
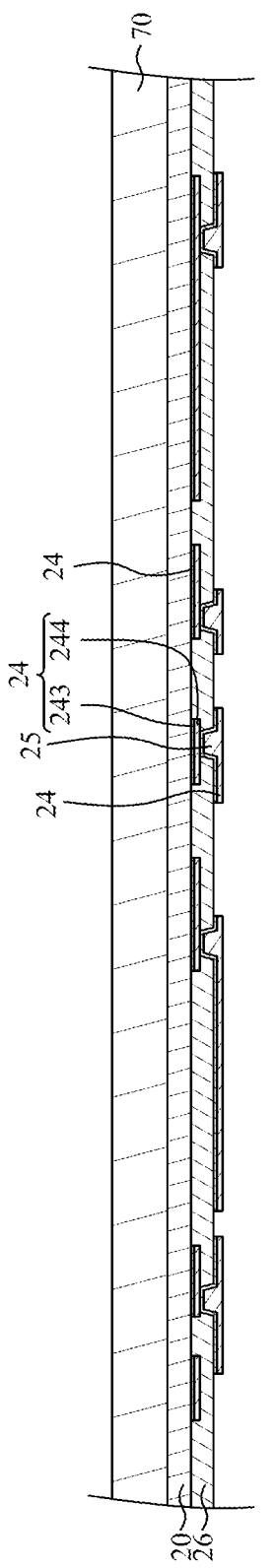
FIG. 22 illustrates one or more stages of an example of a method for manufacturing a circuit structure according to some embodiments of the present disclosure.

Referring to FIG. 22, the photoresist layer 74 is removed by a stripping technique or other suitable techniques. Then, portions of the seed layer 243 that are not covered by the conductive material 244 are removed by an etching technique or other suitable techniques. Meanwhile, an inner circuit layer 24 and a plurality of inner conductive vias 25 are formed.

Figure 23:
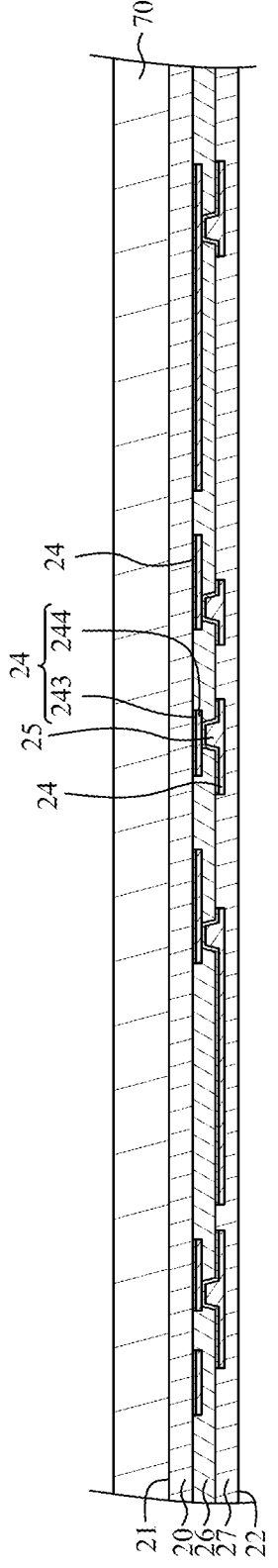
FIG. 23 illustrates one or more stages of an example of a method for manufacturing a circuit structure according to some embodiments of the present disclosure.

Referring to FIG. 23, a third dielectric layer 27 is formed or disposed on the second dielectric layer 26 to cover the inner circuit layer 24 by a coating technique or other suitable techniques.

Figure 24:
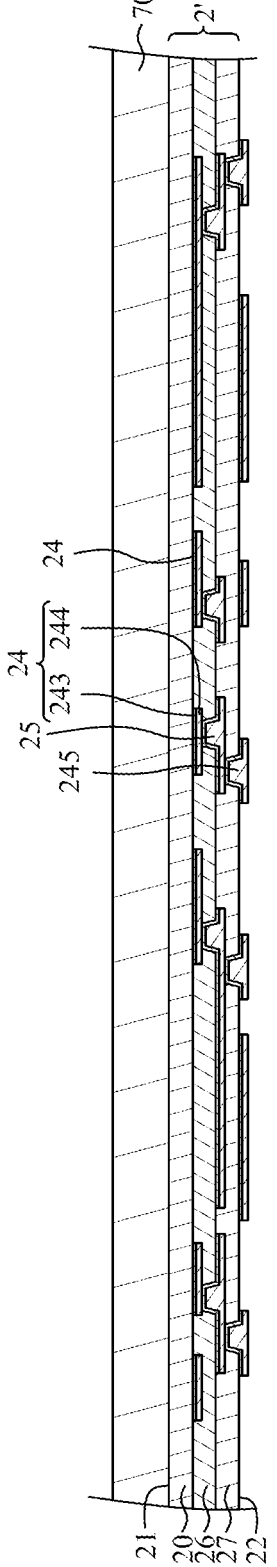
FIG. 24 illustrates one or more stages of an example of a method for manufacturing a circuit structure according to some embodiments of the present disclosure.

Referring to FIG. 24, the stages illustrated in FIG. 20 to FIG. 22 are repeated for at least one time to form a high-density conductive structure 2' on the carrier 70. The high-density conductive structure 2' is similar to the high-density conductive structure 2 of FIG. 1.

Figure 25:
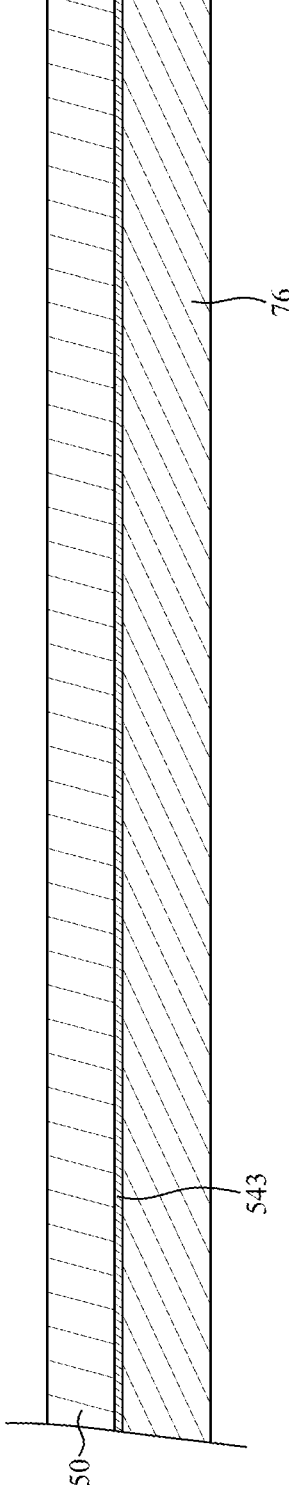
FIG. 25 illustrates one or more stages of an example of a method for manufacturing a circuit structure according to some embodiments of the present disclosure.

Referring to FIG. 25 through FIG. 33, a low-density conductive structure 5 is provided. The low-density conductive structure 5 is manufactured as follows. Referring to FIG. 25, a dielectric layer 50 is provided. Then, a seed layer 543 is formed or disposed on the dielectric layer 50. Then, a photoresist layer 76 is formed or disposed on the seed layer 543 by a coating technique or other suitable techniques.

Figure 26:
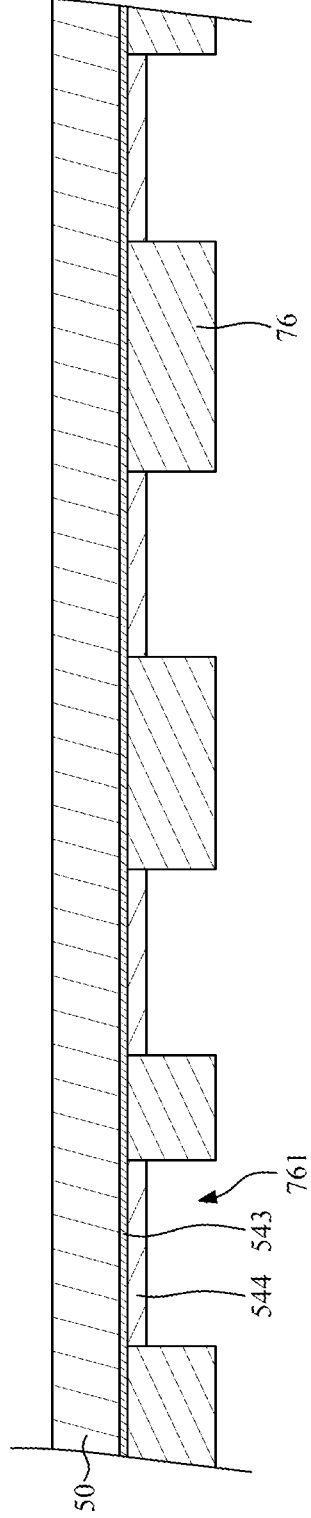
FIG. 26 illustrates one or more stages of an example of a method for manufacturing a circuit structure according to some embodiments of the present disclosure.

Referring to FIG. 26, the photoresist layer 76 is patterned to form a plurality of openings 761 to expose portions of the seed layer 543 by a lithography technique or other suitable techniques. Then, a conductive material 544 is formed or disposed on the exposed portions of the seed layer 543 in the openings 761 of the photoresist layer 76 by a plating technique or other suitable techniques.

Figure 27:
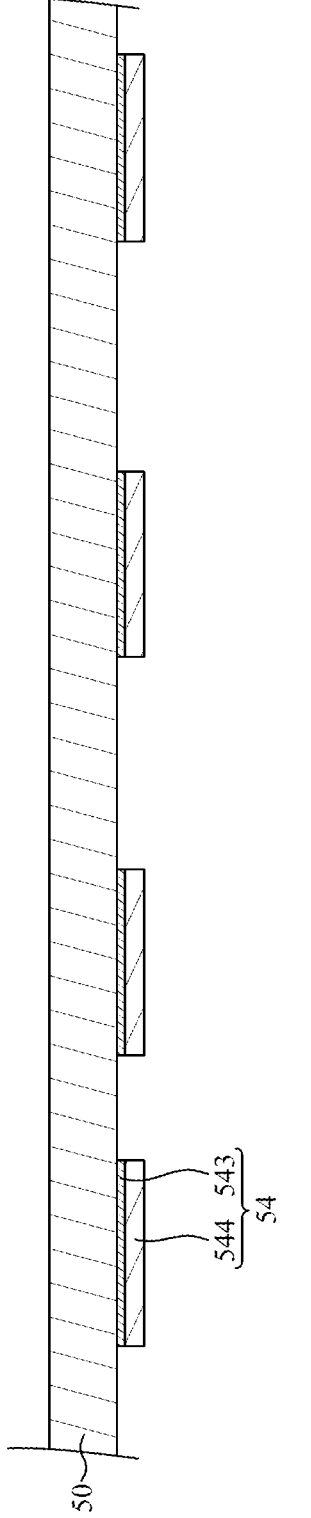
FIG. 27 illustrates one or more stages of an example of a method for manufacturing a circuit structure according to some embodiments of the present disclosure.

Referring to FIG. 27, the photoresist layer 76 is removed by a stripping technique or other suitable techniques. Then, portions of the seed layer 543 that are not covered by the conductive material 544 are removed by an etching technique or other suitable techniques. Meanwhile, a lower circuit layer 54 is formed.

Figure 28:
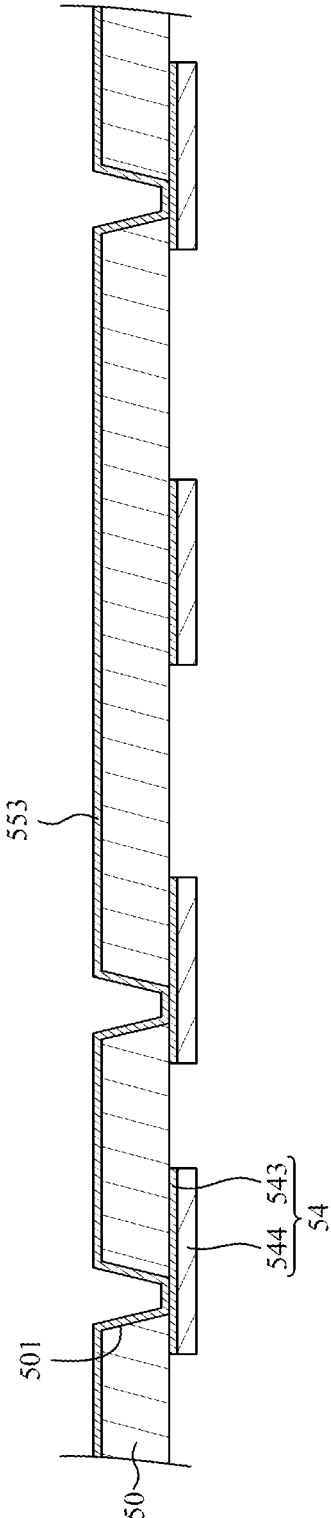
FIG. 28 illustrates one or more stages of an example of a method for manufacturing a circuit structure according to some embodiments of the present disclosure.

Referring to FIG. 28, the dielectric layer 50 is patterned to form a plurality of openings 501 to expose portions of the seed layer 543 of the lower circuit layer 54 by a lithography technique or other suitable techniques. Then, a seed layer 553 is formed or disposed on the dielectric layer 50 and in the openings 501 to contact the exposed portions of the seed layer 543 of the lower circuit layer 54 by a physical vapor deposition (PVD) technique or other suitable techniques.

Figure 29:
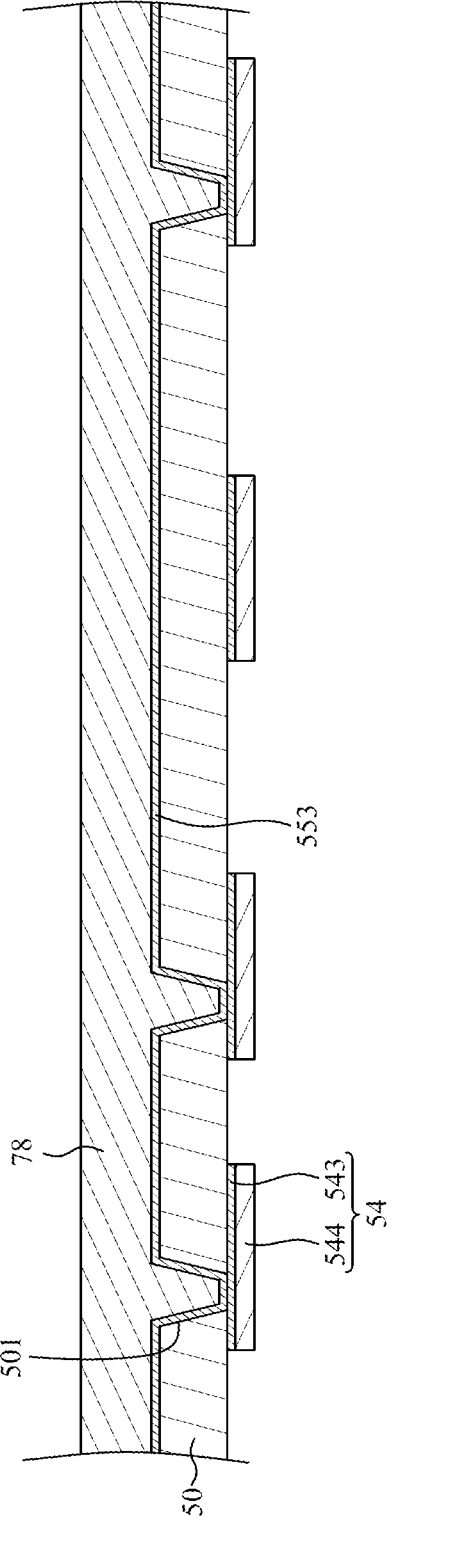
FIG. 29 illustrates one or more stages of an example of a method for manufacturing a circuit structure according to some embodiments of the present disclosure.

Referring to FIG. 29, a photoresist layer 78 is formed or disposed on the seed layer 553 by a coating technique or other suitable techniques.

Figure 30:
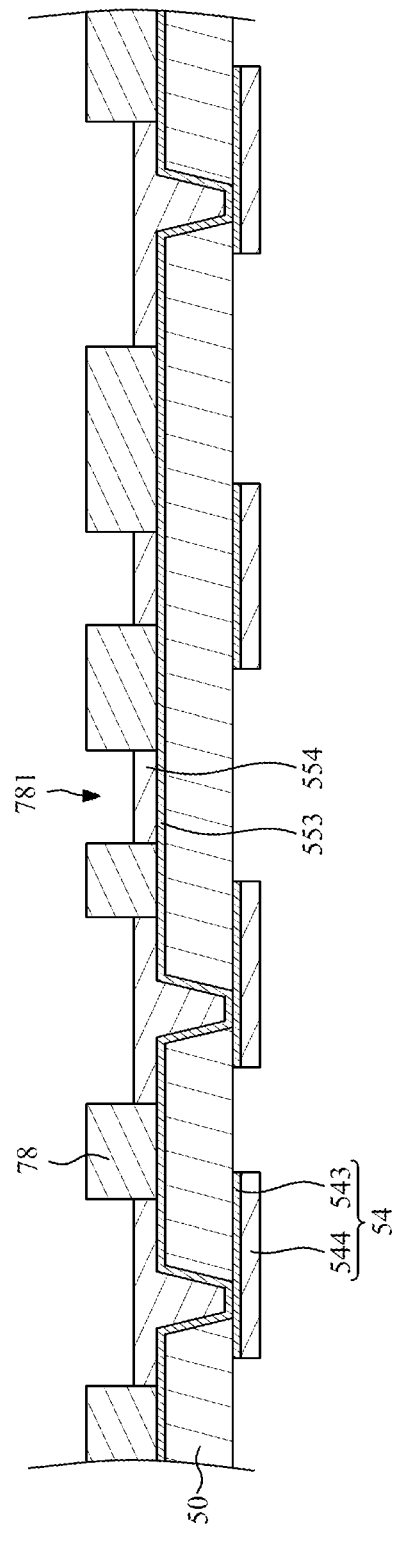
FIG. 30 illustrates one or more stages of an example of a method for manufacturing a circuit structure according to some embodiments of the present disclosure.

Referring to FIG. 30, the photoresist layer 78 is patterned to form a plurality of openings 781 to expose portions of the seed layer 553 by a lithography technique or other suitable techniques. Then, a conductive material 554 is formed or disposed on the exposed portions of the seed layer 553 on the dielectric layer 50 and in the openings 501 of the dielectric layer 50 by a plating technique or other suitable techniques.

Figure 31:
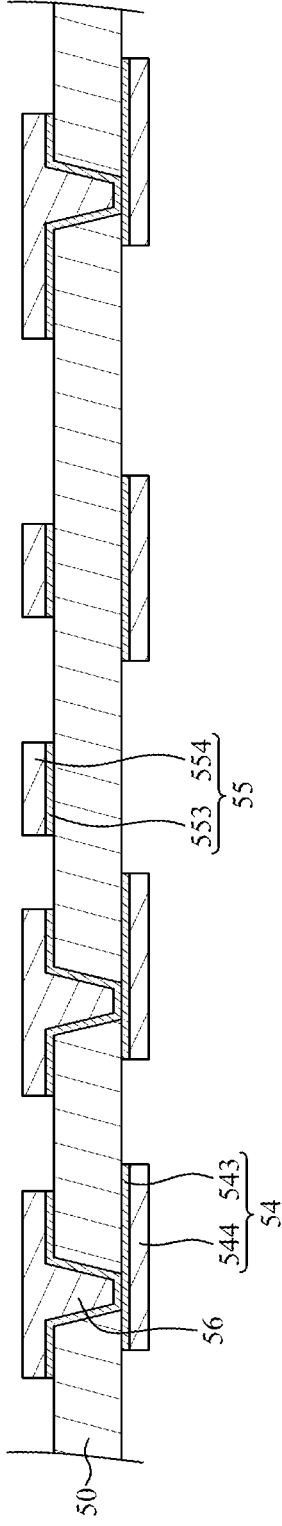
FIG. 31 illustrates one or more stages of an example of a method for manufacturing a circuit structure according to some embodiments of the present disclosure.

Referring to FIG. 31, the photoresist layer 78 is removed by a stripping technique or other suitable techniques. Then, portions of the seed layer 553 that are not covered by the conductive material 554 are removed by an etching technique or other suitable techniques. Meanwhile, an upper circuit layers 55 and a plurality of inner conductive vias 56 are formed.

Figure 32:
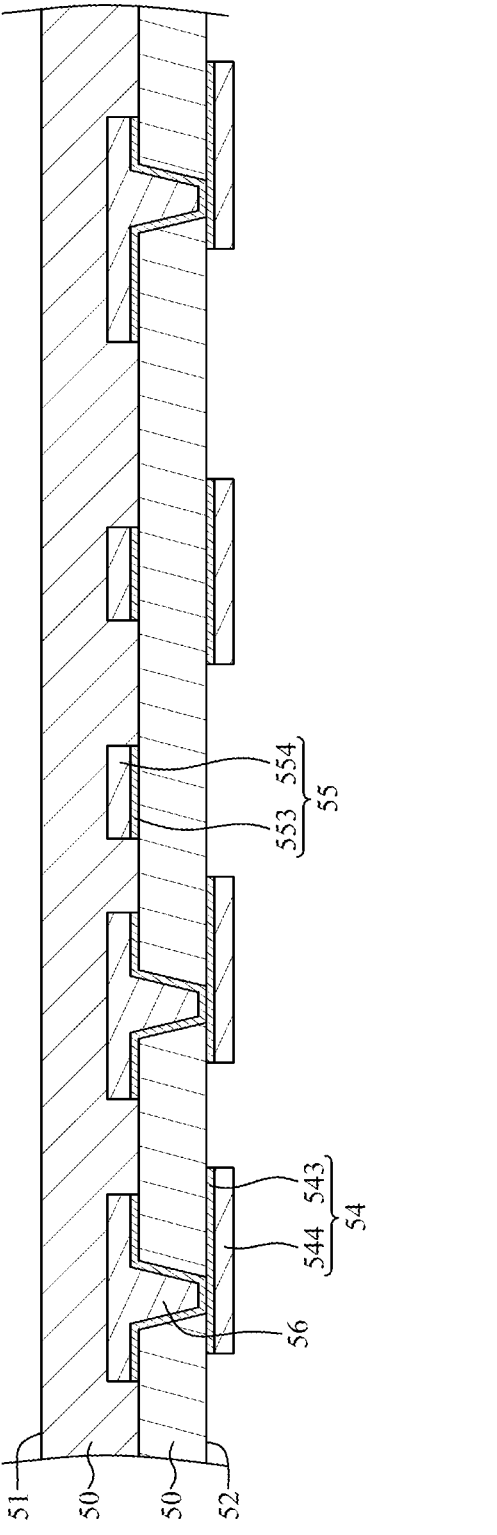
FIG. 32 illustrates one or more stages of an example of a method for manufacturing a circuit structure according to some embodiments of the present disclosure.

Referring to FIG. 32, an upper dielectric layer 50 is formed or disposed on the dielectric layer 50 to cover the upper circuit layers 55 by a coating technique or other suitable techniques.

Figure 33:
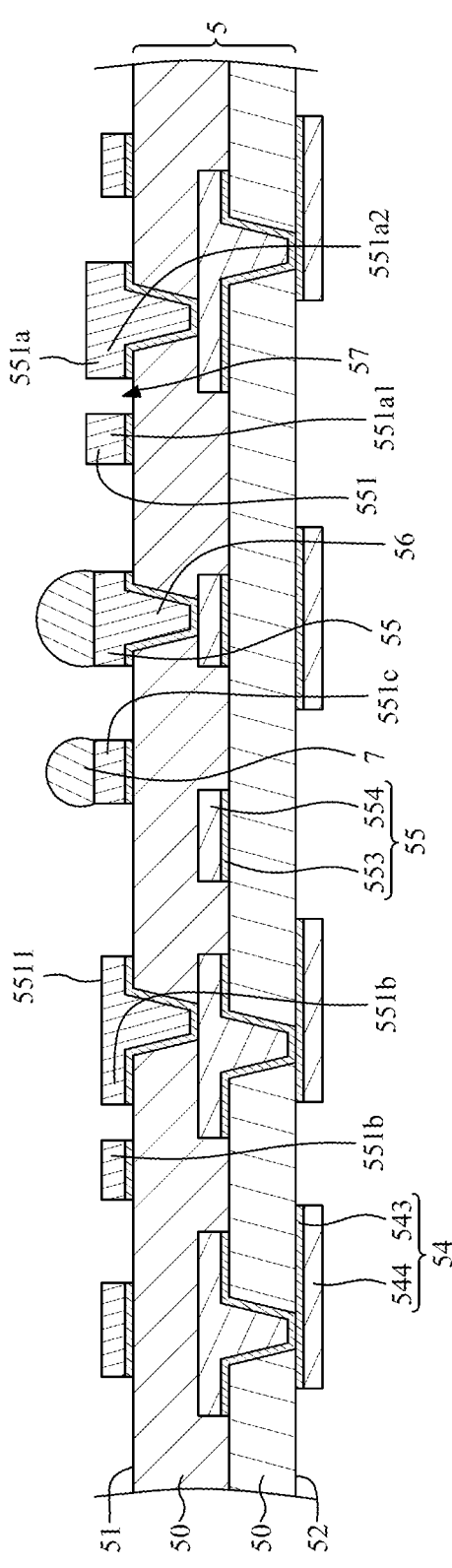
FIG. 33 illustrates one or more stages of an example of a method for manufacturing a circuit structure according to some embodiments of the present disclosure.

Referring to FIG. 33, the stages illustrated in FIG. 28 to FIG. 32 are repeated for at least one time to form a low-density conductive structure 5. The low-density conductive structure 5 is similar to the low-density conductive structure 5 of FIG. 1. In addition, at least one interconnector 7 (e.g., solder material) may be formed or disposed on the topmost pads 551 (e.g., the third pad 551c) of the topmost upper circuit layer 55 of the low-density conductive structure 5.

Figure 34:
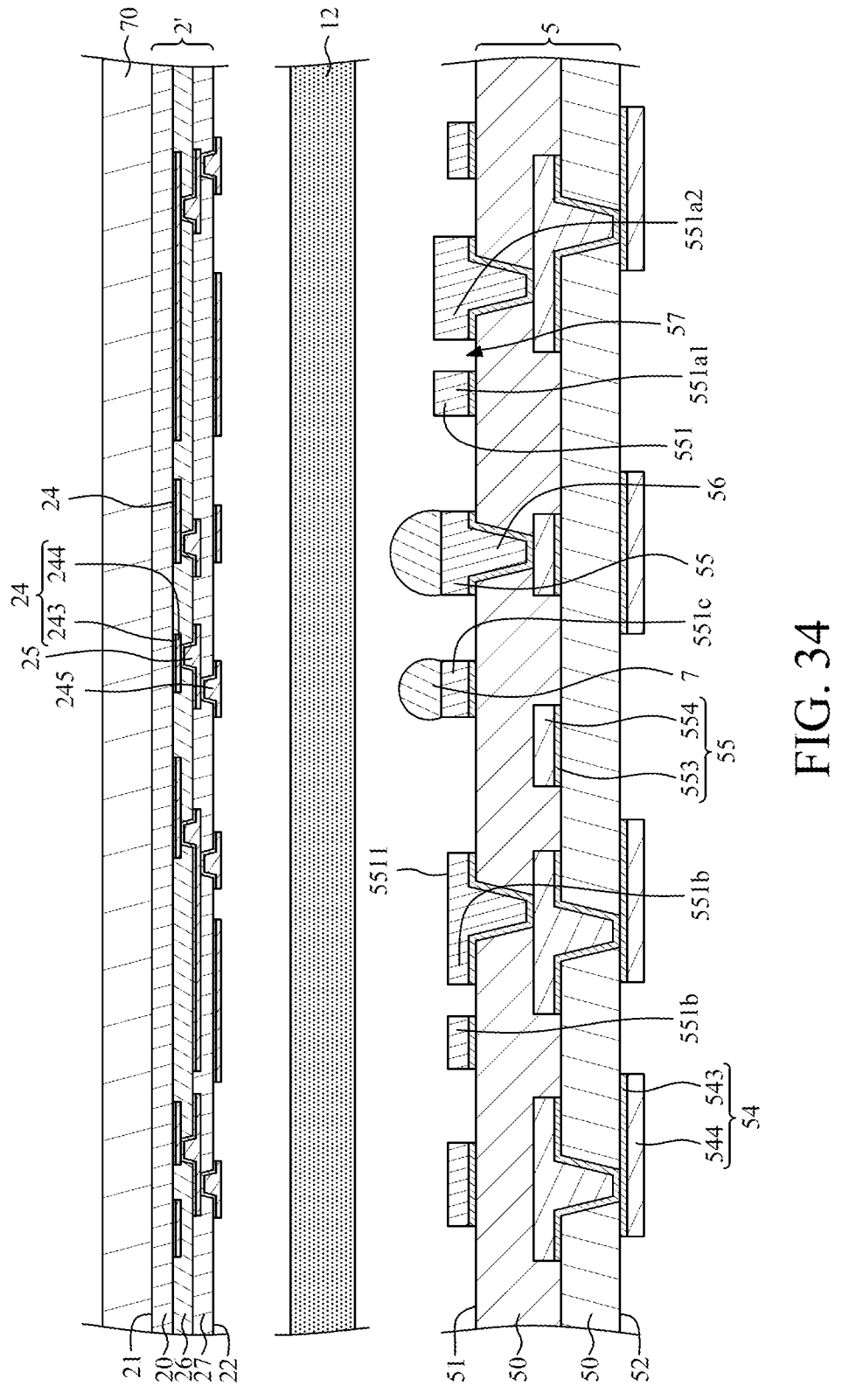
FIG. 34 illustrates one or more stages of an example of a method for manufacturing a circuit structure according to some embodiments of the present disclosure.

Referring to FIG. 34, the high-density conductive structure 2' is attached or bonded to the low-density conductive structure 5 through an adhesive layer 12. Then, the adhesive layer 12 is cured to form an adhesion layer 12.

Figure 35:
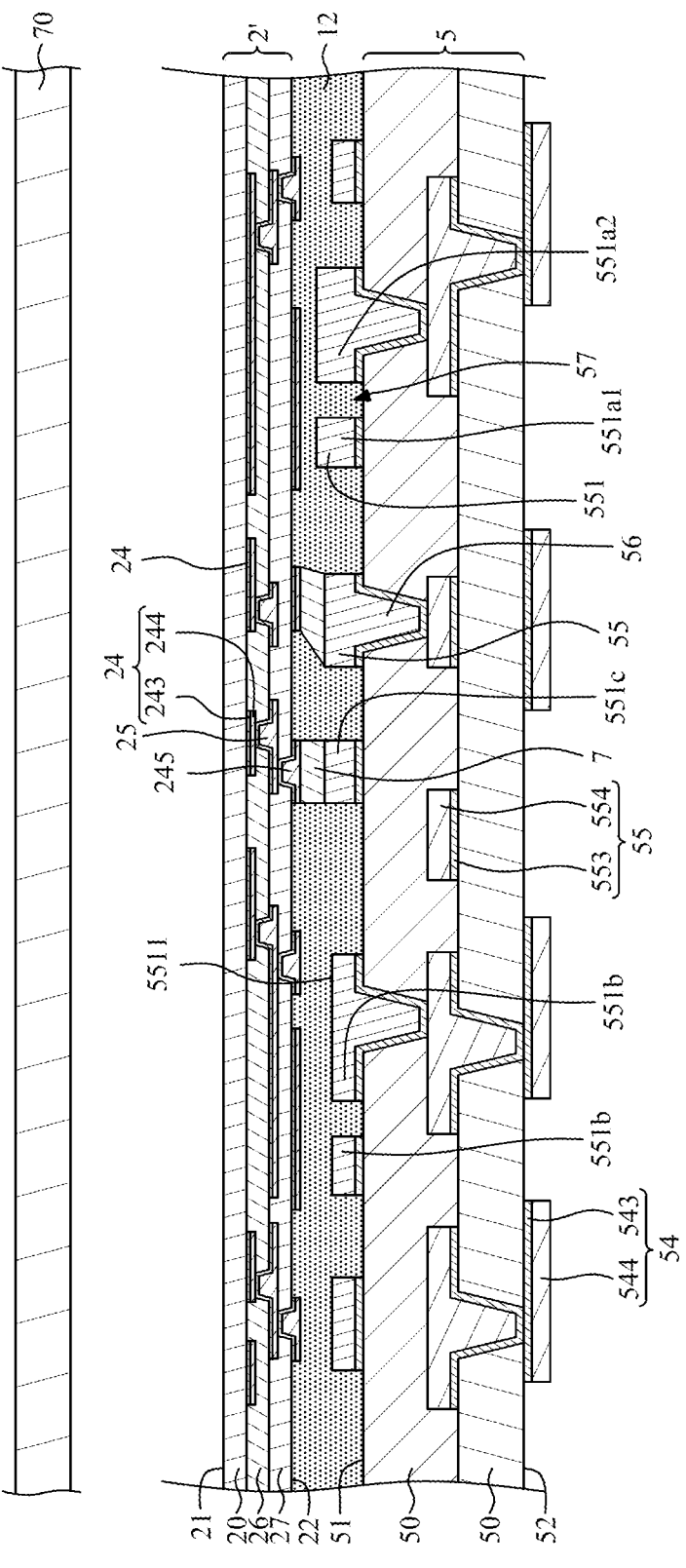
FIG. 35 illustrates one or more stages of an example of a method for manufacturing a circuit structure according to some embodiments of the present disclosure.

Referring to FIG. 35, the carrier 70 is removed.

Figure 36:
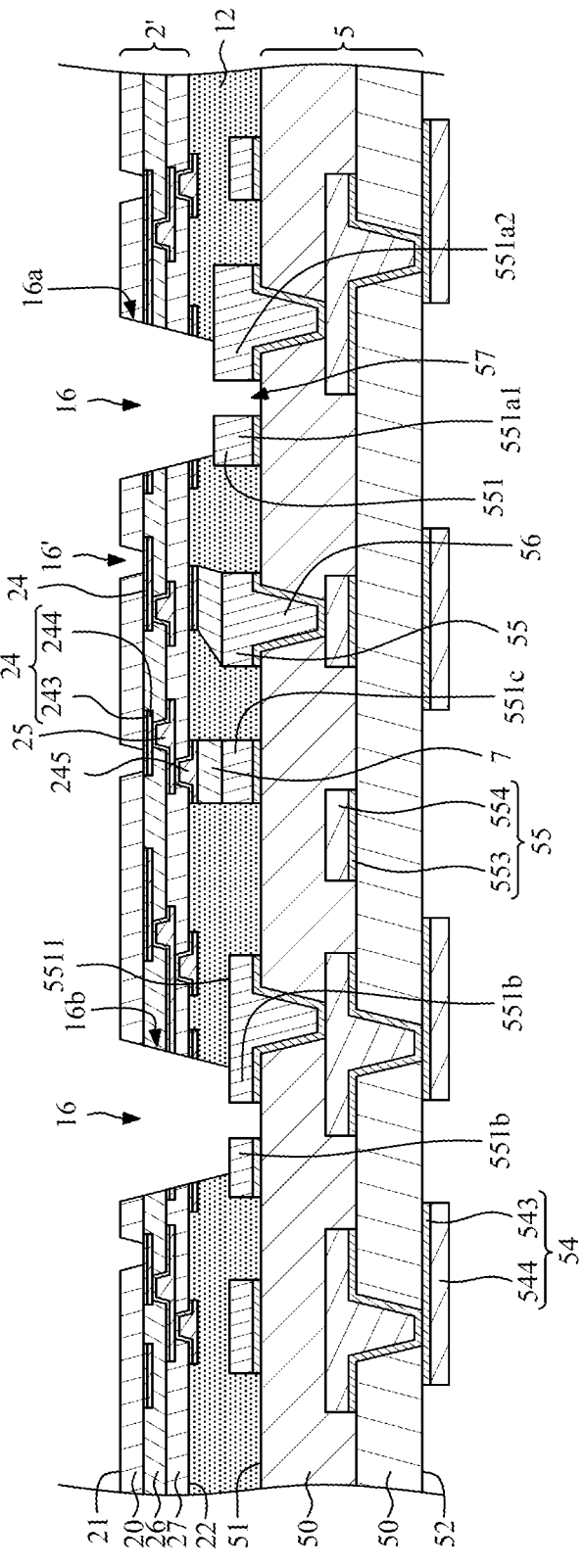
FIG. 36 illustrates one or more stages of an example of a method for manufacturing a circuit structure according to some embodiments of the present disclosure.

Referring to FIG. 36, a portion of the high-density conductive structure 2' is removed to form at least one opening 16 (e.g., the first opening 16a and the second opening 16b) by, for example, laser drilling or plasma etching, from the top surface 21 of the high-density conductive structure 2'. The opening 16 (e.g., the first opening 16a and the second opening 16b) may extend through the high-density conductive structure 2' and the adhesion layer 12. The opening 16 (e.g., the first opening 16a and the second opening 16b) may expose the topmost pads 551 (including the first pad 551a and the second pad 551b) and a portion of the upper dielectric layer 50 of the low-density conductive structure 5. In addition, a plurality of openings 16' may be formed to expose portions of the inner circuit layer 24.

Figure 37:
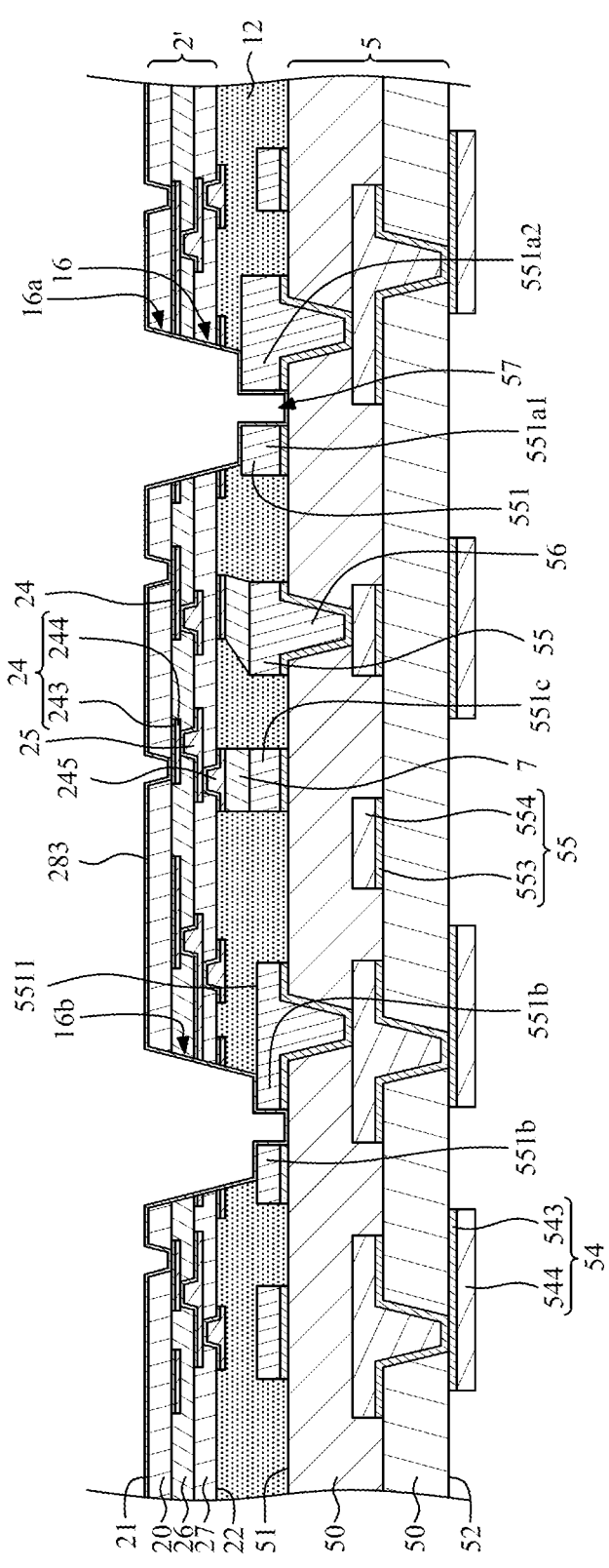
FIG. 37 illustrates one or more stages of an example of a method for manufacturing a circuit structure according to some embodiments of the present disclosure.

Referring to FIG. 37, a seed layer 283 is formed or disposed on the top surface 21 of the high-density conductive structure 2' and in the opening 16 (e.g., the first opening 16a and the second opening 16b) to contact the exposed topmost pads 551 (including the first pad 551a and the second pad 551b) and the exposed portion of the upper dielectric layer 50 of the low-density conductive structure 5. In addition, seed layer 283 may be formed or disposed in the openings 16' to contact the exposed portions of the inner circuit layer 24.

Figure 38:
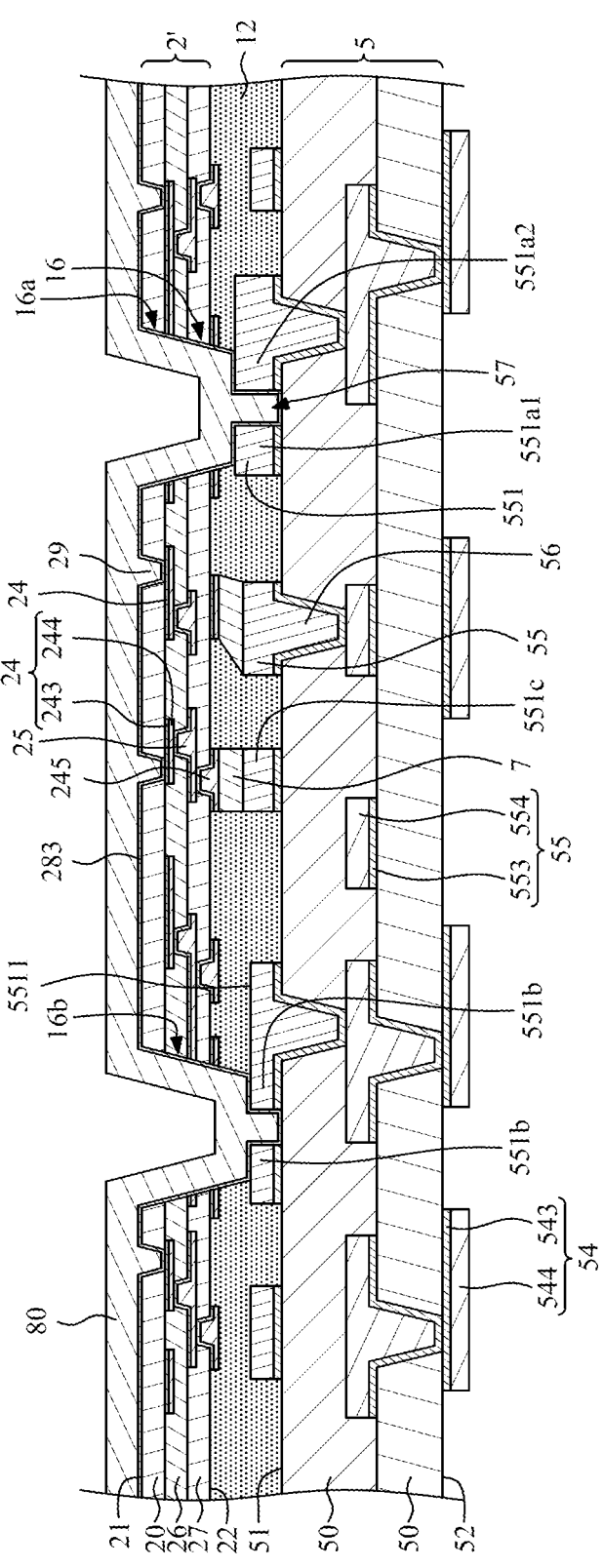
FIG. 38 illustrates one or more stages of an example of a method for manufacturing a circuit structure according to some embodiments of the present disclosure.

Referring to FIG. 38, a photoresist layer 80 is formed or disposed on the seed layer 283 by a coating technique or other suitable techniques.

Figure 39:
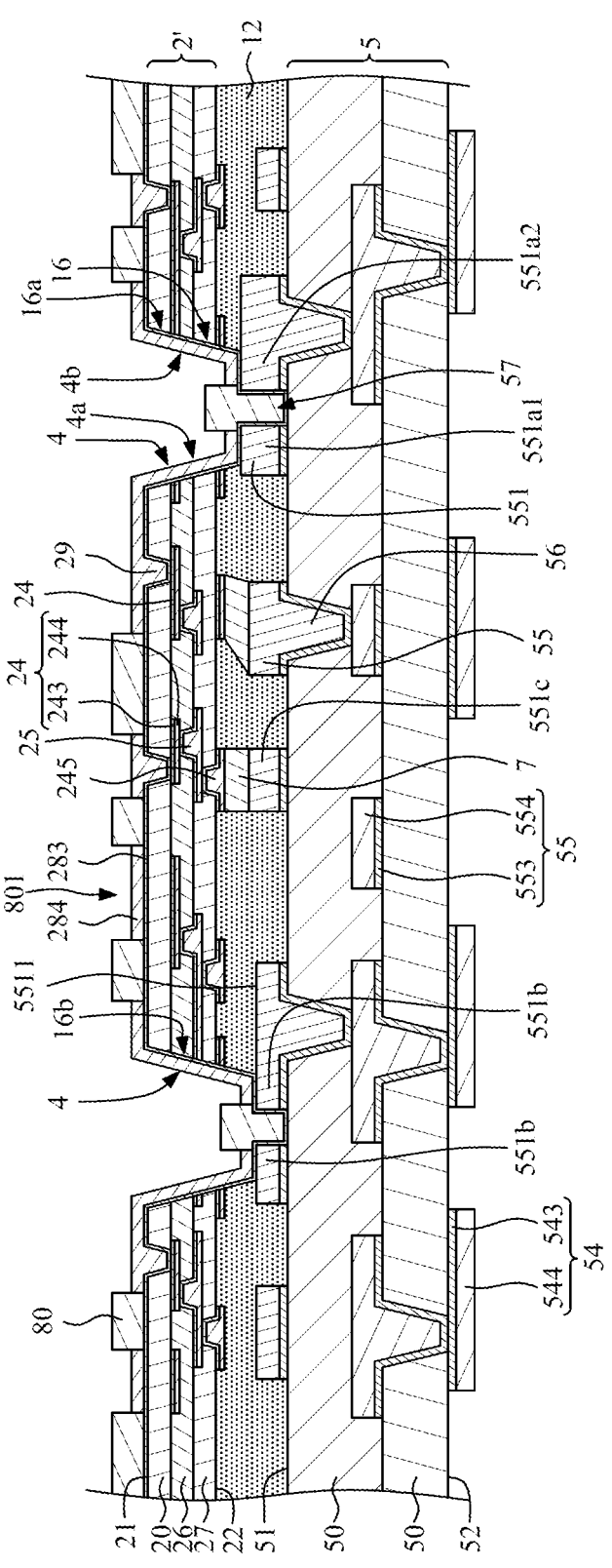
FIG. 39 illustrates one or more stages of an example of a method for manufacturing a circuit structure according to some embodiments of the present disclosure.

Referring to FIG. 39, the photoresist layer 80 is patterned to form a plurality of openings 801 to expose portions of the seed layer 283 by a lithography technique or other suitable techniques. Then, a conductive material 284 is formed or disposed on the exposed portions of the seed layer 283 on the first dielectric layer 20 and in the opening 16 (e.g., the first opening 16a and the second opening 16b) by a plating technique or other suitable techniques.

Then, the photoresist layer 80 is removed by a stripping technique or other suitable techniques. Then, portions of the seed layer 283 that are not covered by the conductive material 284 are removed by an etching technique or other suitable techniques. Meanwhile, an outer circuit layer 28 and a plurality of outer conductive vias 29 are formed.

Then, a singulation process may be conducted so as to obtain the circuit structure 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A circuit structure, comprising:
   a low-density conductive structure;
   a high-density conductive structure disposed over the low-density conductive structure, and defining an opening extending from a top surface of the high-density conductive structure to a bottom surface of the high-density conductive structure, wherein the opening exposes a first pad and a second pad of the low-density conductive structure, wherein the second pad is spaced apart from the first pad; and
   a plurality of traces extending from the top surface of the high-density conductive structure into the opening, wherein the plurality of traces include a first trace connecting to the first pad and a second trace connecting to the second pad, wherein the first trace includes a first portion, a second portion and a middle portion connecting the first portion and the second portion, the first portion contacts the top surface of the high-density conductive structure, the second portion contacts the first pad, the middle portion contacts an inner sidewall of the opening, wherein the first trace includes two turning points.

2. The circuit structure of claim 1, wherein the first pad and the second pad are disposed on a topmost dielectric layer of the low-density conductive structure, the opening further includes a second portion extending into the topmost dielectric layer of the low-density conductive structure.

3. The circuit structure of claim 1, wherein the first pad has a first top surface, the second pad has a second top surface, and a level of the first top surface is different from a level of the second top surface.

4. The circuit structure of claim 1, wherein a first one of the two turning points is located at an intersection of the first portion and the middle portion, wherein a second one of the two turning points is located at an intersection of the second portion and the middle portion.

5. The circuit structure of claim 4, wherein the first trace is a one-piece structure and includes a step structure.

6. The circuit structure of claim 1, wherein the first portion of the first trace is substantially parallel with the second portion of the first trace, wherein a thickness of the first portion of the first trace is substantially equal to a thickness of the second portion of the first trace.

7. The circuit structure of claim 6, wherein a thickness of the middle portion of the first trace is substantially equal to the thickness of the first portion of the first trace.

8. The circuit structure of claim 6, wherein the middle portion of the first trace includes an upper portion connecting the first portion and a lower portion connecting the second portion, wherein in a cross-sectional view perpendicular to the inner sidewall of the opening, a horizontal width of the upper portion is greater than a horizontal width of the lower portion.

9. The circuit structure of claim 8, wherein in a front view as viewed from a direction perpendicular to the inner sidewall of the opening, a horizontal width of the upper portion is greater than a horizontal width of the lower portion.

10. The circuit structure of claim 6, wherein a top surface of the first portion of the first trace is substantially parallel with the top surface of the high-density conductive structure, and a top surface of the second portion of the first trace is substantially parallel with a top surface of the first pad.

11. The circuit structure of claim 1, wherein the second portion of the first trace includes a seed layer and a conductive material disposed on the seed layer, wherein an end surface of the seed layer is substantially aligned with an end surface of the conductive material.

12. The circuit structure of claim 1, wherein three lateral surfaces of the second portion of the first trace are exposed in the opening.

13. The circuit structure of claim 12, wherein three lateral surfaces of the first pad are exposed in the opening.

14. The circuit structure of claim 1, wherein the high-density conductive structure includes a plurality of conductive patterned layers, wherein the middle portion of the first trace contacts the plurality of conductive patterned layers.

15. The circuit structure of claim 14, wherein the plurality of conductive patterned layers are electrically connected to each other through a plurality of inner vias, a tapering direction of the plurality of inner vias is different from a tapering direction of the opening.

16. A circuit structure, comprising:
a low-density conductive structure;
a high-density conductive structure disposed over the low-density conductive structure, and defining an opening extending through the high-density conductive structure; and
a plurality of electrical traces spaced apart from each other and disposed in the opening, wherein the plurality of electrical traces are configured to electrically connect the high-density conductive structure and the low-density conductive structure, wherein a length of the opening in a top view is greater than a depth of the opening in a cross-sectional view.

17. The circuit structure of claim 16, wherein the low-density conductive structure includes a topmost circuit layer, the topmost circuit layer includes a high-density region and a low-density region outside the high-density region, wherein the high-density region is exposed in the opening and is electrically connected to the high-density conductive structure through the plurality of electrical traces, wherein the low-density region is electrically connected to the high-density conductive structure through at least one solder material.

18. The circuit structure of claim 16, wherein the plurality of electrical traces include a plurality of first traces and a plurality of second traces, wherein the plurality of first traces are spaced apart from each other and disposed on a first inner sidewall of the opening, wherein the plurality of second traces are spaced apart from each other and disposed on a second inner sidewall of the opening.

19. The circuit structure of claim 16, wherein the length of the opening in the top view is greater than a thickness of the circuit structure in the cross-sectional view.

20. The circuit structure of claim 16, wherein the opening exposes a first pad and a second pad of a topmost circuit layer of the low-density conductive structure, wherein the high-density conductive structure further defines a second opening extending through the high-density conductive structure and extending into the low-density conductive structure, wherein the second opening exposes a third pad and a fourth pad of a second circuit layer of the low-density conductive structure, wherein the second circuit layer of the low-density conductive structure is lower than the topmost circuit layer of the low-density conductive structure.

* * * * *